US008255849B1

(12) United States Patent
Okhmatovski et al.

(10) Patent No.: US 8,255,849 B1
(45) Date of Patent: Aug. 28, 2012

(54) SOLVER FOR MODELING A MULTILAYERED INTEGRATED CIRCUIT WITH THREE-DIMENSIONAL INTERCONNECTS

(75) Inventors: Vladimir Okhmatovski, Winnipeg (CA); Mengtao Yuan, Santa Clara, CA (US); Rodney Phelps, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 581 days.

(21) Appl. No.: 12/423,722

(22) Filed: Apr. 14, 2009

Related U.S. Application Data

(60) Provisional application No. 61/120,648, filed on Dec. 8, 2008.

(51) Int. Cl.
G06F 17/50 (2006.01)
(52) U.S. Cl. ...................................................... 716/110
(58) Field of Classification Search .................. 716/100, 716/110
See application file for complete search history.

(56) References Cited

U.S. PATENT DOCUMENTS

| | | | | |
|---|---|---|---|---|
| 6,665,849 | B2 * | 12/2003 | Meuris et al. | 716/134 |
| 7,127,688 | B2 | 10/2006 | Ling et al. | |
| 7,506,294 | B2 * | 3/2009 | Dengi et al. | 716/119 |
| 7,539,961 | B2 * | 5/2009 | Dengi et al. | 716/109 |
| 7,765,497 | B2 * | 7/2010 | Cheng et al. | 716/115 |
| 2002/0042698 | A1 * | 4/2002 | Meuris et al. | 703/2 |
| 2007/0157133 | A1 * | 7/2007 | Cheng et al. | 716/4 |
| 2008/0120083 | A1 * | 5/2008 | Dengi et al. | 703/14 |
| 2008/0120084 | A1 * | 5/2008 | Dengi et al. | 703/14 |
| 2009/0006053 | A1 * | 1/2009 | Carazzone et al. | 703/5 |

OTHER PUBLICATIONS

Bleszynski et al., "AIM' Adaptive Integral Method for Solving Large-Scale Electromagnetic Scattering and Radiation Problems"; Radio Science, vol. 31, No. 5, pp. 1225-1251, Sep.-Oct. 1996.

Cui et al., "Fast Algorithm for Electromagnetic Scattering by Buried 3-D Dielectric Objects of Large Size"; IEEE Transactions on Geoscience and Remote Sensing, vol. 37, No. 5, pp. 2597-2608, Sep. 1999.

Ling et al, "An Efficient Algorithm for Analyzing Large-Scale Microstrip Structures Using Adaptive Integral Method Combined With Discrete Complex-Image Method"; IEEE Transactions on Microwave Theory and Techniques, vol. 48, No. 5, pp. 832-839, May 2000.

Ling et al., "Large-scale Broadband Parasitic Extraction for Fast Layout Verification of 3-D RF and Mixed-Signals On-chip Structures"; IEEE Transactions on Microwave Theory and Techniques, vol. 53, No. 1, Jan. 2005.

Michalski et al., "Electromagnetic Scattering and Radiation by Surfaces of Arbitrary Shape in Layered Media, Part I: Theory"; IEEE Transactions on Antennas and Propagation, vol. 38, No. 3, pp. 335-344, Mar. 1990.

(Continued)

Primary Examiner — Suchin Parihar
(74) Attorney, Agent, or Firm — Schwegman, Lundberg & Woessner, P.A.

(57) ABSTRACT

Systems and methods for modeling a multilayer integrated circuit include three-dimensional interconnect models in multilayered substrates for greater accuracy. Mesh models are used to resolve effects of nearby elements and grid models are used to resolve effects of far-away elements. Sidewall mesh elements of three-dimensional interconnects are projected onto parallel (or substantially parallel) grids between the top and bottom walls of the interconnects so that grid models can be used to resolve three-dimensional effects of interconnects in multilayered substrates.

25 Claims, 16 Drawing Sheets

OTHER PUBLICATIONS

Phillips et al., "A Precorrected-FFT Method for Electrostatic Analysis of Complicated 3-D Structures"; IEEE Transactions on Computer-Aided Design of Integrated Circuits and Systems, vol. 16, No. 10, pp. 1059-1072, Oct. 1997.

Okhmatovski et al., "Method and Apparatus for Broadband Electromagnetic Modeling of Three-Dimensional Interconnects Embedded in Multilayered Substrates"; U.S. Appl. No. 12/423,714, filed Apr. 14, 2009.

* cited by examiner

SOLVER FOR MODELING A MULTILAYERED INTEGRATED CIRCUIT WITH THREE-DIMENSIONAL INTERCONNECTS

CROSS REFERENCE TO RELATED APPLICATIONS

This application claims the benefit of U.S. Provisional Application No. 61/120,648, filed Dec. 8, 2008, and incorporated herein by reference in its entirety.

BACKGROUND OF THE INVENTION

1. Field of the Invention

The present invention relates to the design of multi-layer circuits, e.g., integrated circuits or printed circuits, and, more particularly, to determining the electromagnetic effects on the performance of a multi-layer circuit with three-dimensional interconnects from a bias applied to the circuit.

2. Description of Related Art

As the size of electrical devices and interconnecting conductors of multi-layer circuits, especially multi-layer integrated circuits, continues to decrease and the bandwidth of operation continues to increase, the effects on the performance of the circuit due to electromagnetic effects in the various layers of the circuit have become more pronounced.

According to some conventional approaches, analysis of these effects on each circuit layer has been limited to evaluating such effect due to current flowing only in the layer itself. See for example, "*An Efficient Algorithm For Analyzing Large-Scale Microstrip Structures Using Adaptive Integral Method Combined With Discrete Complex-Image Method*", by Ling et al., IEEE Transactions On Microwave Theory And Techniques, Vol. 48, No. 5, pp. 832-839, (May 2000); "*AIM: Adaptive Integral Method For Solving Large-Scale Electromagnetic Scattering And Radiation Problems*", by Bleszynski et al., Radio Science, Volume 31, Number 5, Pages 1225-1251, (September-October 1996); and "*A Precorrected-FFT Method For Electrostatic Analysis Of Complicated 3-D Structures*", by Phillips et al., IEEE Transactions On Computer-Aided Design Of Integrated Circuits And Systems, Vol. 16, No. 10, pp. 1059-1072, (October 1997).

While this approach has been applied successfully in the past, the increasing density of devices and the reduction in size of interconnecting conductors in the design of multi-layer circuits has required that the effects on the performance of the circuit due to the cumulative effects of currents flowing in all of the layers of the circuit be considered. Furthermore, the development of nanometer-scale technologies has enabled denser integration of functional components in silicon substrates and led to more stringent requirements for design verification. As a result, conventional modeling of the layers has become inadequate and more accurate three-dimensional modeling of the electromagnetic effects will be needed for future applications.

Thus, there is a need for improved methods and related tools for electromagnetic modeling of multi-layer circuits.

SUMMARY OF THE INVENTION

In one embodiment of the present invention, a method of determining a distribution of voltages or currents in an integrated circuit (IC) in response to energizing the circuit design with an exemplary bias is directed towards an IC that includes one or more layers that each include a top wall, a bottom wall and a sidewall that connects the top wall and the bottom wall where the one or more layers are disposed on a substrate. The method includes discretizing an exemplary current that flows in each layer in response to an application of an exemplary bias into a plurality of current vector elements on that layer, where the current-vector elements include top-wall current-vector elements, bottom-wall current-vector elements, and sidewall current-vector elements. The method further includes projecting the current-vector elements onto a grid that includes a plurality of sub-grids that each include multiple grid points, where the sub-grids include one or more top grids for the one or more top walls and one or more bottom grids for the one or more bottom walls. The method further includes determining for each layer from the projected current vector elements a spectrum of an electromagnetic (em) field induced in the layer by using impedance values for the one or more layers and the substrate to extend the em field across the IC and determining a distribution of voltages induced in each layer from the spectrum of the em field induced in said layer.

One or more values for voltages can be saved in a computer-readable medium. For example, values for voltages can be saved directly or through some related characterization in memory (e.g., RAM (Random Access Memory)) or permanent storage (e.g., a hard-disk system).

According to one aspect of this embodiment, the em field may be a first em field and the distribution of voltages may be a first distribution of voltages, and the method may further include: determining for each current vector element on each layer at least one corresponding scalar-charge element on said layer, wherein the scalar-charge elements include top-wall scalar-charge elements, bottom-wall scalar-charge elements, and sidewall scalar-charge elements. Further, according to this aspect, the method may include projecting the scalar-charge elements onto the grid; determining for each layer from the projected scalar-charge elements a spectrum of a second em field induced in the layer. Further, according to this aspect, the method may include determining a second distribution of voltages induced in each circuit layer from the spectrum of the second em field induced in said layer; and determining for each layer from the first and second distributions of voltages induced in the layer, a combined distribution of voltages in the layer.

According to another aspect, projecting the current-vector elements onto the grid may include: projecting top-wall values onto a sub-grid for the corresponding top wall, projecting bottom-wall values onto a sub-grid for the corresponding bottom wall, and projecting sidewall values onto one or more sub-grids for said layer.

According to another aspect, determining the spectrum of the em field induced in each layer may include: calculating values for an impulse-response function between two grid points by including impedance effects of the substrate near the two grid points.

According to another aspect, determining the spectrum of the em field induced in each layer may include: determining for each pair of sub-grids, a distribution of an em field induced in one of said pair of sub-grids (target sub-grid) in response to an effect of at least one current vector element on the other of said pair of sub-grids (source sub-grid), where each sub-grid acting as both the target sub-grid and the source sub-grid comprises one of said pair of sub-grids; and determining for each em field distribution, a corresponding em field spectrum. Further, according to this aspect, this may include, for each instance where each sub-grid is the target sub-grid of a pair of sub-grids, combining the current spectrum determined for said sub-grid with the first em field spectrum determined for said instance of said sub-grid to obtain a spectrum of an induced vector field distribution matrix for said instance of said sub-grid. Further, according to this aspect, this may include, for instances where each layer is the target sub-grid of a pair of sub-grids, combining the spectrums of the induced vector field distribution matrices associated with said instances to obtain the spectrum of the em field induced in said grid.

According to another aspect, two or more of the sub-grids may lie in substantially parallel planes with uniformly spaced grid points. Depending on the operational setting, these sub-grids may lie in parallel planes or planes that are approximately parallel (e.g., within some engineering tolerance such as 10%). Uniform spacing of all grid points or a substantial portion of the grid points within a sub-grid enables improved computational efficiency for related spectral computations (e.g., as in the FFT (Fast Fourier Transform)).

According to another aspect, the sub-grids may include, for at least one layer, one or more intermediate grids that lie between the corresponding top and bottom grids.

According to another aspect, for at least one layer the corresponding top wall and bottom wall may be substantially planar and parallel to one another and the corresponding sidewall may be substantially transverse to the top and bottom walls. Depending on the operational setting, the top wall and bottom wall may be planar and parallel to one another or approximately planar and parallel to one another (e.g., within some engineering tolerance such as 10%). Likewise, the sidewall may be transverse to the top and bottom walls or approximately transverse to the top and bottom walls (e.g., within some engineering tolerance such as 10%).

In another embodiment of the present invention, a method of modeling an integrated circuit (IC) is directed to an IC that includes one or more layers that each include a top wall, a bottom wall and a sidewall that connects the top wall and bottom wall where the one or more layers are disposed on a substrate. The method includes specifying a mesh for modeling the IC with a mesh model, where the mesh includes mesh elements for defining values on the mesh from discrete values of the mesh elements, the mesh elements including top-wall elements for the one or more top walls, bottom-wall elements for the one or more bottom walls, and sidewall elements for the one or more sidewalls. The method further includes specifying a grid for a modeling of the IC with a grid model, where the grid includes grid points for defining values on the grid, the grid including a top grid for each top wall and a bottom grid for each bottom wall. The method further includes determining projection values for projecting values from the mesh to the grid; and determining interpolation values for interpolating values from the grid to the mesh. The method further includes, for at least some mesh elements, specifying at least some other mesh elements as nearby mesh elements or far-away mesh elements, whereby corresponding pairs of mesh elements are specified as nearby mesh-element pairs or far-away mesh-element pairs. The method further includes: determining direct values for modeling impedances at nearby mesh-element pairs of the IC by using the mesh model to calculate impedance values on the mesh for the one or more layers and the substrate; determining indirect values for modeling impedances at far-away mesh-element pairs of the IC by using the grid model to calculate impedance values on the grid for the one or more layers and the substrate and using the projection values and the interpolation values to relate the grid and the mesh; and determining pre-correction values for correcting impedances from the grid model at nearby mesh-element pairs, where the direct values, the indirect values and the pre-correction values provide a decomposition of impedances for the IC and provide a corresponding decomposition of voltage values for specified current values of the IC.

One or more impedance values for the IC can be saved in a computer-readable medium. For example, values for impedances can be saved directly or through some related characterization in memory (e.g., RAM (Random Access Memory)) or permanent storage (e.g., a hard-disk system).

This embodiment may include aspects described above. According to another aspect, the method may further include specifying current values at the mesh elements for modeling current flow in the IC; determining nearby components for the voltage values corresponding to the nearby mesh-element pairs from the current values, the direct values, and the pre-correction values by calculating values on the mesh; determining far-away components for the voltage values corresponding to the far-away mesh-element pairs from the current values and the indirect values by projecting values from the mesh to the grid, convolving values on the grid, and interpolating values from the grid to the mesh; determining voltage values at the mesh elements by combining the nearby components and the far-away components; and saving one or more voltage values for the IC. Further, according to this aspect, the grid may include sub-grids that lie in substantially parallel planes, and convolving values on the grid may include operations for transforming from spatial values to spectral values and operations for transforming from spectral values to spatial values. Depending on the operational setting, these sub-grids may lie in parallel planes or planes that are approximately parallel (e.g., within some engineering tolerance such as 10%).

According to another aspect, the grid may include a plurality of sub-grids that lie in substantially parallel planes with uniformly spaced grid points. Depending on the operational setting, these sub-grids may lie in parallel planes or planes that are approximately parallel (e.g., within some engineering tolerance such as 10%). Uniform spacing of all grid points or a substantial portion of the grid points within a sub-grid enables improved computational efficiency for related spectral computations (e.g., as in the FFT (Fast Fourier Transform)).

According to another aspect, for at least one layer, the grid may include one or more intermediate grids that lie between the top grid and the bottom grid, and the top grid, the bottom grid and the one or more intermediate grids may lie in substantially parallel planes. Depending on the operational setting, these sub-grids may lie in parallel planes or planes that are approximately parallel (e.g., within some engineering tolerance such as 10%).

According to another aspect, determining the direct values may include calculating a basis-function expansion for modeling an electromagnetic field across the integrated circuit by a summation of basis functions that are defined across mesh elements by interpolations of corresponding mesh-element values.

According to another aspect, determining the indirect values may include calculating a spatial-frequency expansion for modeling an electromagnetic field across the integrated circuit by a summation of spatial-frequency functions that are defined across the grid.

According to another aspect, determining the indirect values may include calculating values for an impulse-response function between two grid points by including impedance effects of the substrate near the two grid points.

According to another aspect, for at least one layer the top wall and the bottom wall are substantially planar and parallel to one another and the sidewall is substantially transverse to the top and bottom walls.

According to another aspect, the projection values may project values from each sidewall to portions of the grid that are connected by that sidewall.

According to another aspect, specifying pairs of mesh elements as nearby mesh-element pairs or far-away mesh-element pairs may include calculating a distance between mesh-element pairs and comparing the distance between mesh-element pairs to a threshold distance.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer. In these ways the present invention enables improved methods and related tools for electromagnetic modeling of multi-layer circuits.

DETAILED DESCRIPTION OF EXEMPLARY EMBODIMENTS

Figure 1A:
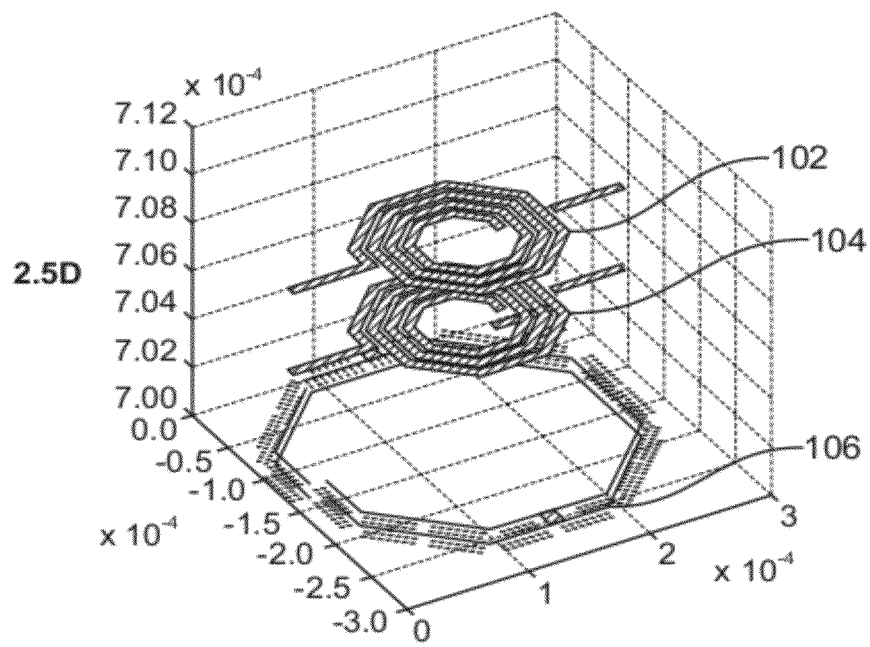
FIG. 1A shows a conventional 2.5D model of a spiral inductor.

FIG. 1A shows a conventional "2.5D model" (i.e., 2.5 dimensional) of a spiral inductor with a mesh model for a top wall 102 and a bottom wall 104. A lower layer 106 on the substrate is also shown. The 2.5D model supports current flow in the x-direction and y-direction only while implicitly introducing z-directed currents (i.e., normal to the substrate) in association with the via currents. See, for example, "*Method and apparatus for determining interactive electromagnetic effects among conductors of a multi-layer circuit*", U.S. Pat. No. 7,127,688, issued Oct. 24, 2006, which is incorporated by reference in its entirety. See also "*Large-scale Broadband Parasitic Extraction for Fast Layout Verification of 3-D RF* and *Mixed-Signals On-chip Structures*", F. Ling et al., IEEE Transactions on Microwave Theory and Techniques, Vol. 53, No. 1, January 2005.

Figure 1B:
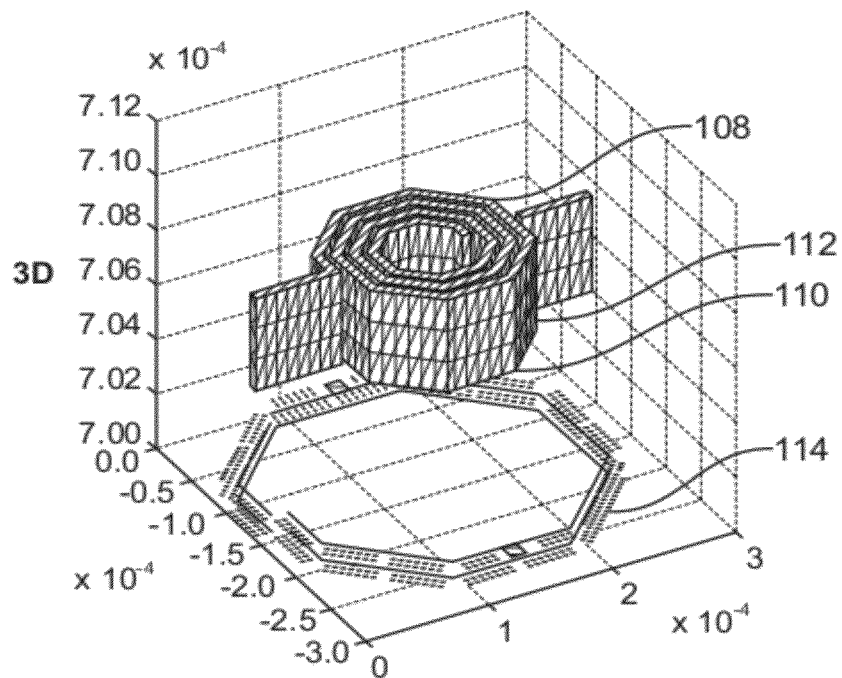
FIG. 1B shows a 3D model of a spiral inductor according to an embodiment of the present invention.

In general, the 2.5D model has provided sufficient accuracy in when the layout conductors are predominantly thin. In today's 90 nm and 45 nm IC designs, however, the conductor's thickness may become comparable or even exceed the conductor's width in some metal layers. For example, FIG. 1B shows a "3D model" for a spiral inductor in accordance with certain embodiments of the present invention as discussed below. The mesh model includes a top wall 108, a bottom wall 110 and a sidewall 112. A lower layer 114 on the substrate is also shown. Including sidewall mesh elements enables modeling the current flow in the sidewalls 112 for greater model accuracy at a cost of greater modeling complexity. As discussed below in greater detail, specific modeling enhancements relative to conventional approaches related to 3D PFFT (Pre-corrected FFT) include (1) inclusion all seven dyadic terms in the Michalski-Zheng formulation C of MPIE (Mixed Potential Integral Equation), (2) additional 2-D FFT (Fast Fourier Transform) grids between the top wall and the bottom wall of a layer, and (3) dipole currents of x, y, and z orientations are associated with nodes of FFT grids. ("*A Precorrected-FFT Method For Electrostatic Analysis Of Complicated 3-D Structures*", by Phillips et al., IEEE Transactions On Computer-Aided Design Of Integrated Circuits And Systems, Vol. 16, No. 10, pp. 1059-1072, (October 1997)).

Figure 1C:
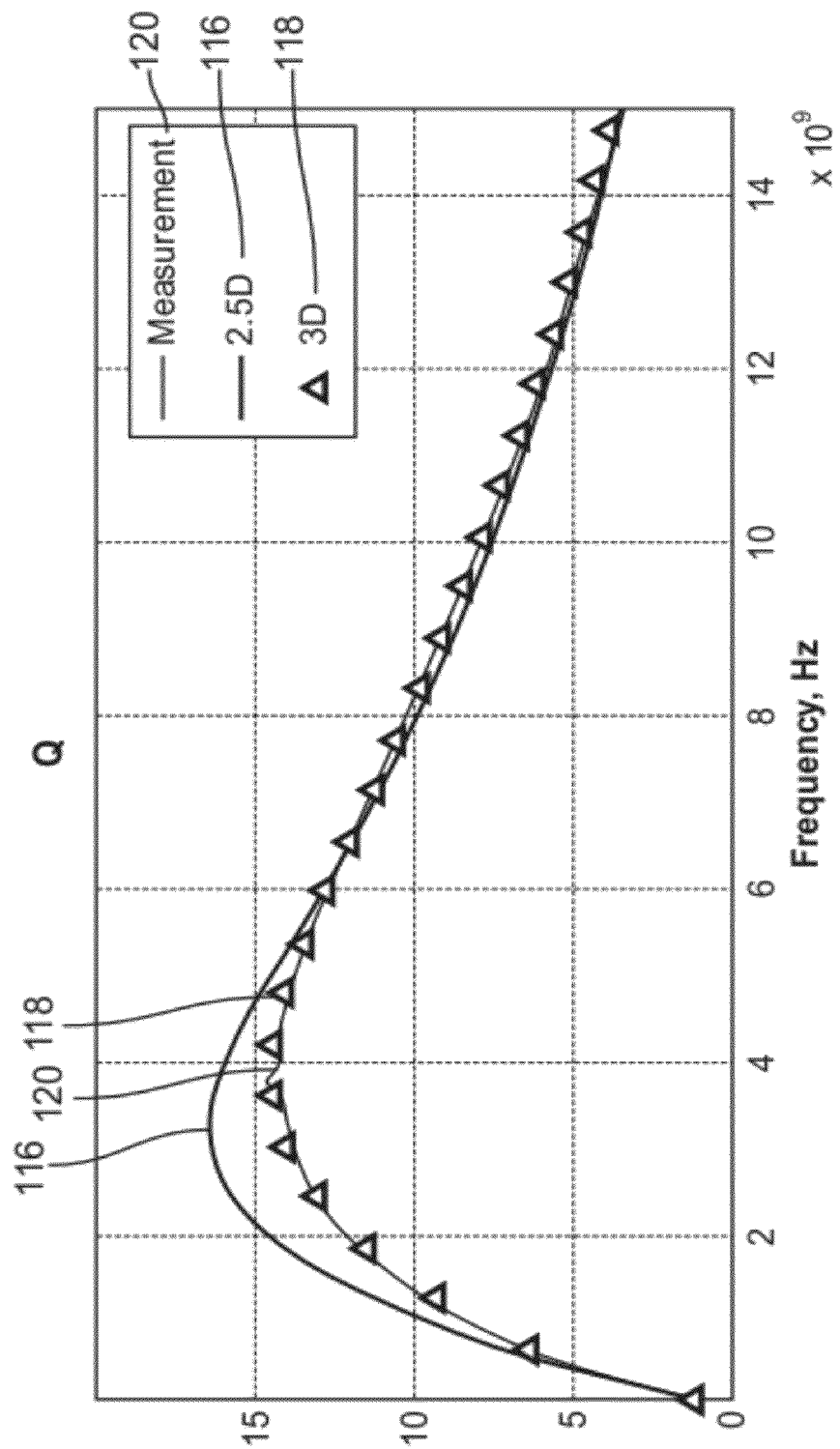
FIG. 1C shows a comparison between the two models for a Q factor calculation.

FIG. 1C shows a representative quality factor evaluation for a nano-scale spiral inductor where calculations for a 2.5D model 116 (FIG. 1A) and a 3D model (FIG. 1B) are compared with measurements taken over a frequency range up to 14 GHz. The 3D model compares favorably with the 2.5D model, especially near the range of 1-5 KHz.

Figure 2A:
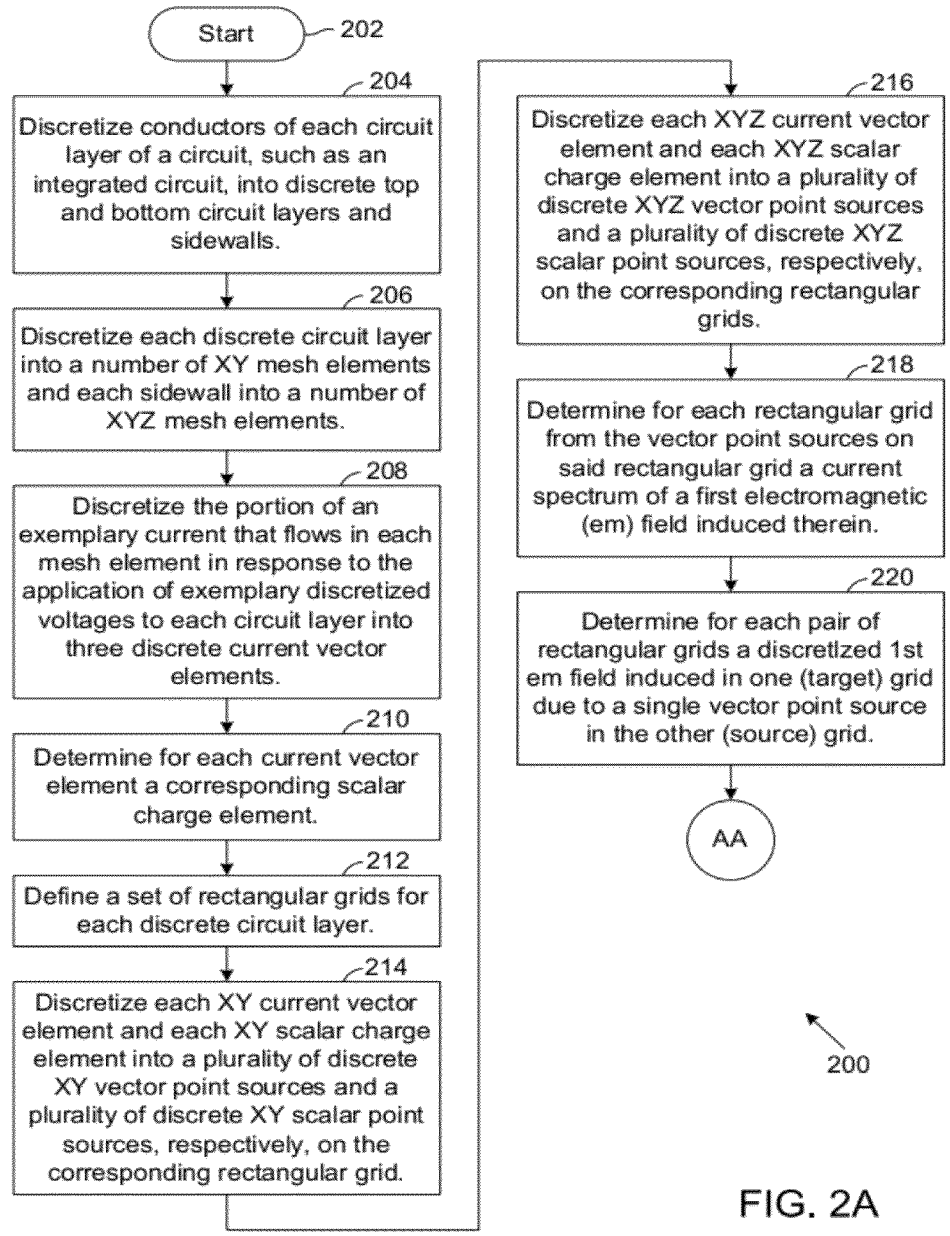
FIGS. 2A-2C show a method of modeling a circuit according to an embodiment of the present invention.
Figure 2B:
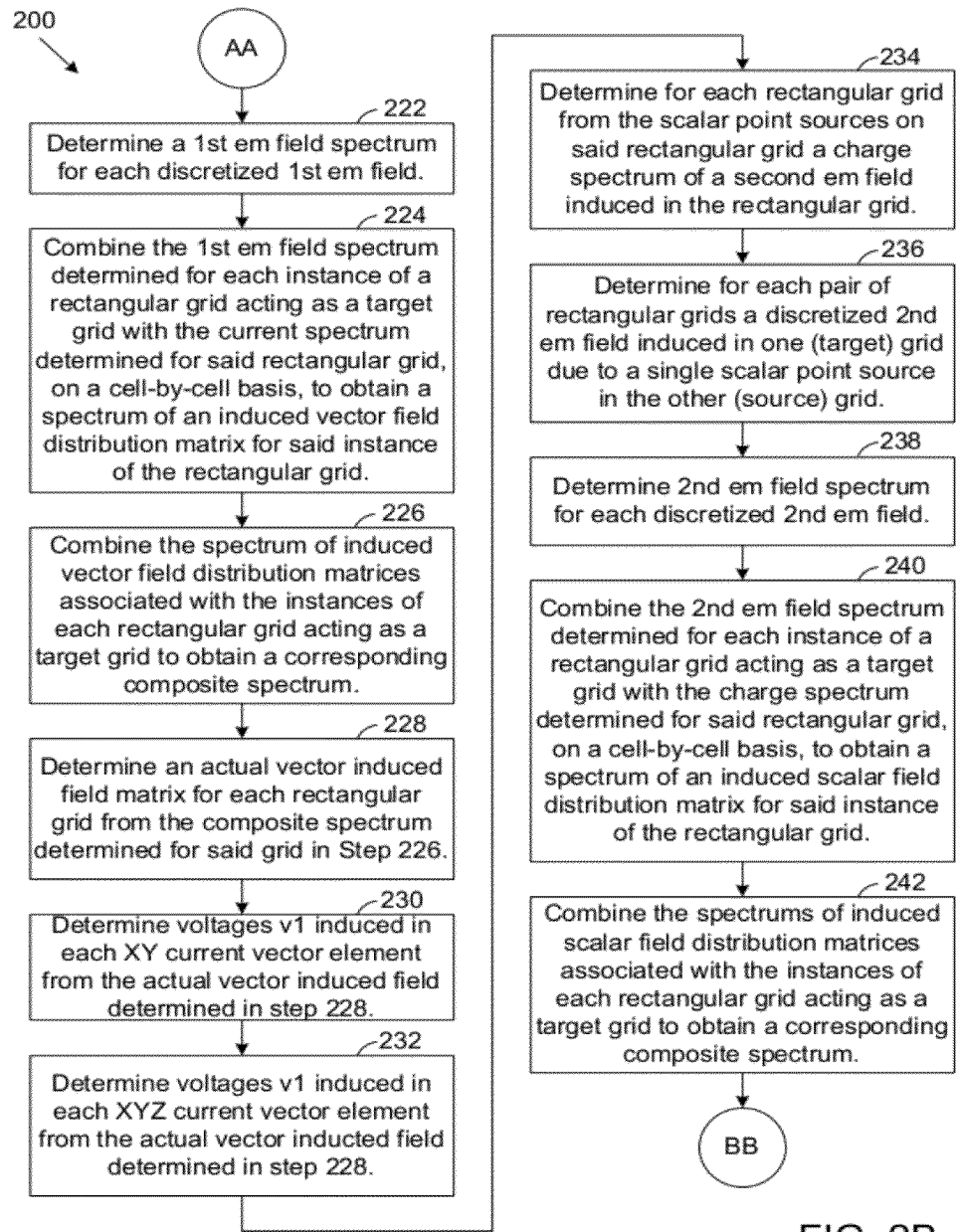
Figure 2C:
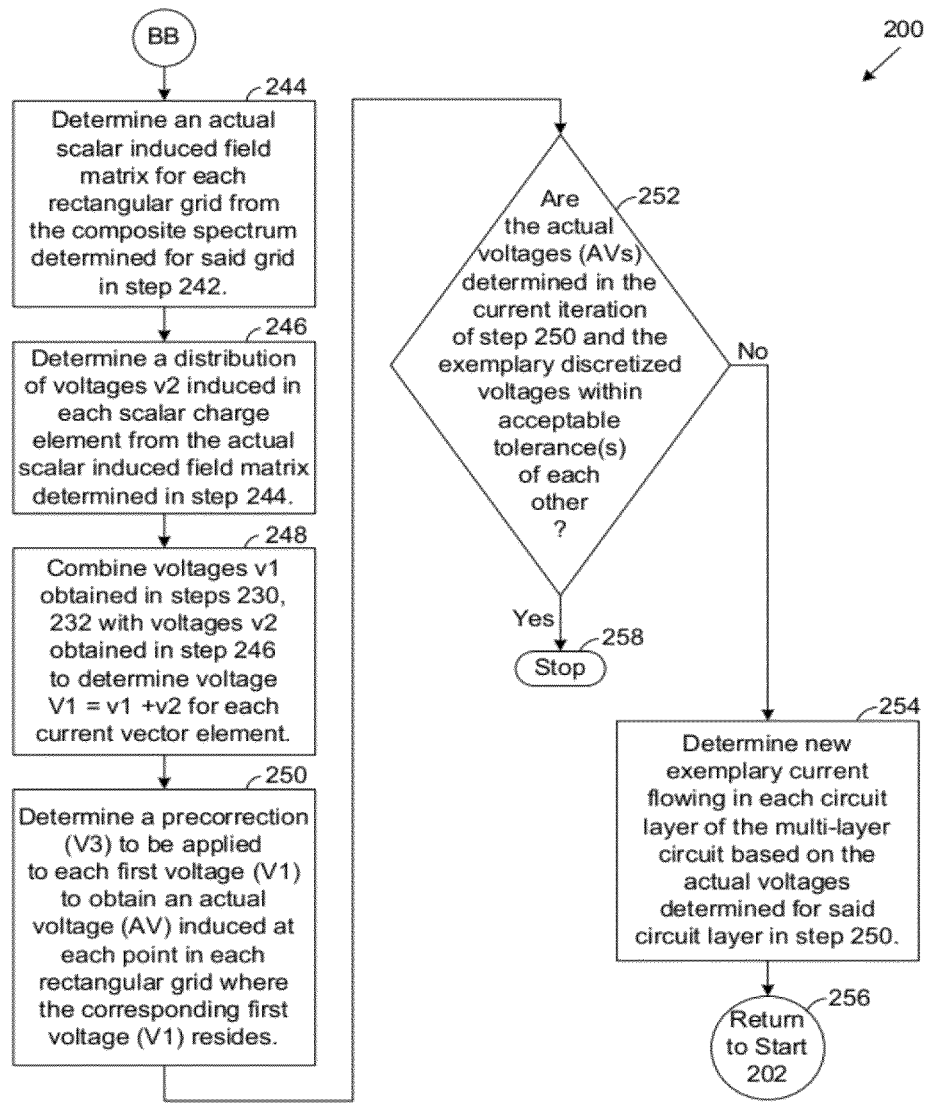
Figure 3A:
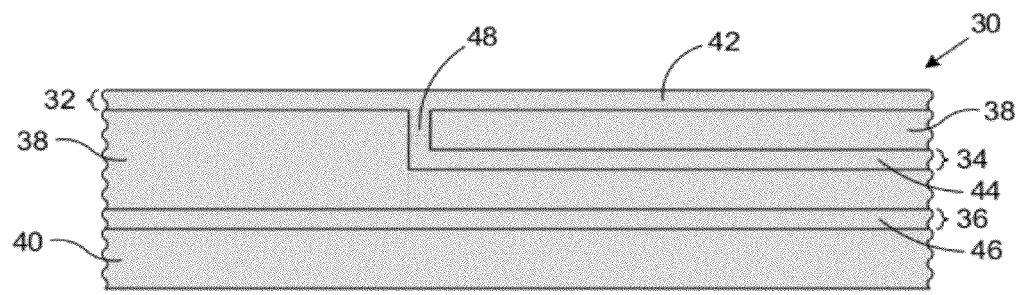
FIG. 3A shows a cross-sectional side view of an integrated circuit illustrating conductors on three separate layers of the circuit with a via extending between conductors in the top two layers of the circuit for an embodiment of the present invention.

FIGS. 2A-2C show a method 200 of modeling a circuit in accordance with an embodiment of the present invention with reference to subsequent FIGS. 3A-7B. FIG. 3A shows a cross-sectional side view of an integrated circuit 30 illustrating conductors on three separate layers of the circuit with a via extending between conductors in the top two layers of the circuit. FIG. 3B shows an isolated side view of the three conductors shown in FIG. 3A after each conductor has been discretized into individual top layers and bottom layers. FIG. 3C shows a three-dimensional version of FIG. 3B. It is well known in the art that each integrated circuit 30 formed on a semiconductor wafer typically includes a plurality of layers 32, 34 and 36, each of which includes corresponding interconnects or conductors 42, 44 and 46, respectively, that connect active devices, passive devices, or both formed on integrated circuit 30 or which define one or more passive devices, such as an inductor (not shown), on integrated circuit 30. Layers 32, 34 and 36 are separated from each other by insulating material 38, such as a thermally grown oxide. Integrated circuit 30 also includes a substrate of semiconducting material 40 that can be suitably doped in a manner known in the art to create one or more junctions of active devices that are formed on integrated circuit 30.

A layout of devices and conductors of multi-layered integrated circuit 30 is accomplished in a manner known in the art before the integrated circuit 30 is actually implemented on a semiconductor wafer. Once this layout is complete, but before the integrated circuit 30 is manufactured, the electromagnetic effects of current flowing in the conductors, e.g., conductors 42, 44 and 46, of each layer, e.g., layers 32, 34 and 36, of integrated circuit 30 in response to the application of exemplary voltage(s) to integrated circuit 30 is desirably determined in accordance with the steps of the flowchart shown in FIGS. 2A-2C to ensure the manufactured integrated circuit 30 will operate according to its design specifications.

Figure 3B:
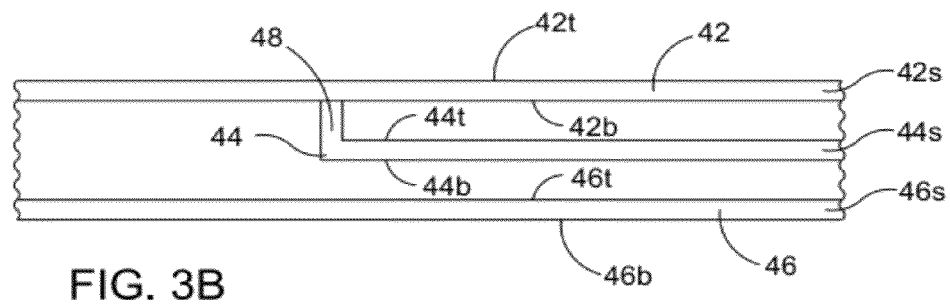
FIG. 3B shows an isolated side view of the three conductors shown in FIG. 3A after each conductor has been discretized into individual top layers and bottom layers.
Figure 3C:
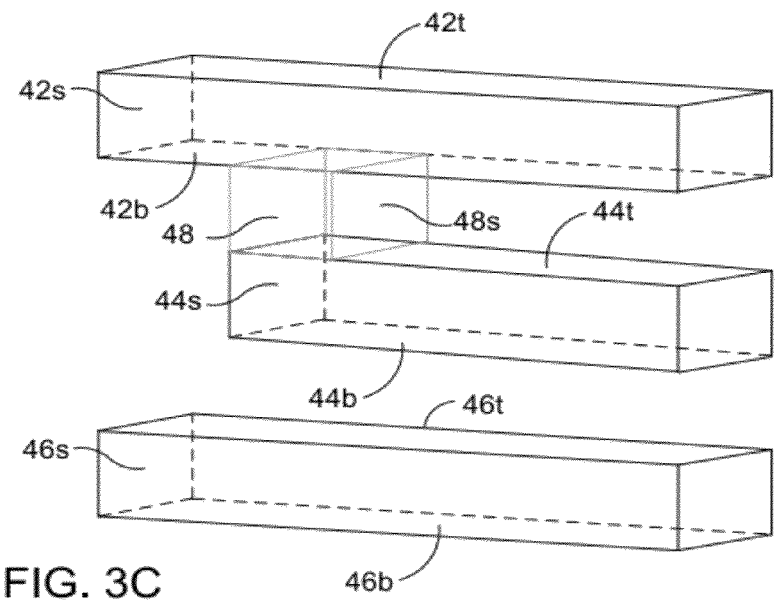
FIG. 3C shows a three-dimensional version of FIG. 3B.

From the start 202 of the method 200, the method advances to a step 204 wherein conductors 42, 44 and 46 of circuit layers 32, 34 and 36, respectively, are initially discretized into discrete top layers 42t, 44t and 46t, discrete bottom layers 42b, 44b and 46b, and discrete side walls 42s, 44s, and 46s, respectively, as shown in FIGS. 3B-3C. In the method shown in the flowchart of FIGS. 2A-2C, any conductive via 48 that electrically connects conductors in adjacent circuit layers of integrated circuit 30 has only side walls 48s.

Figure 4:
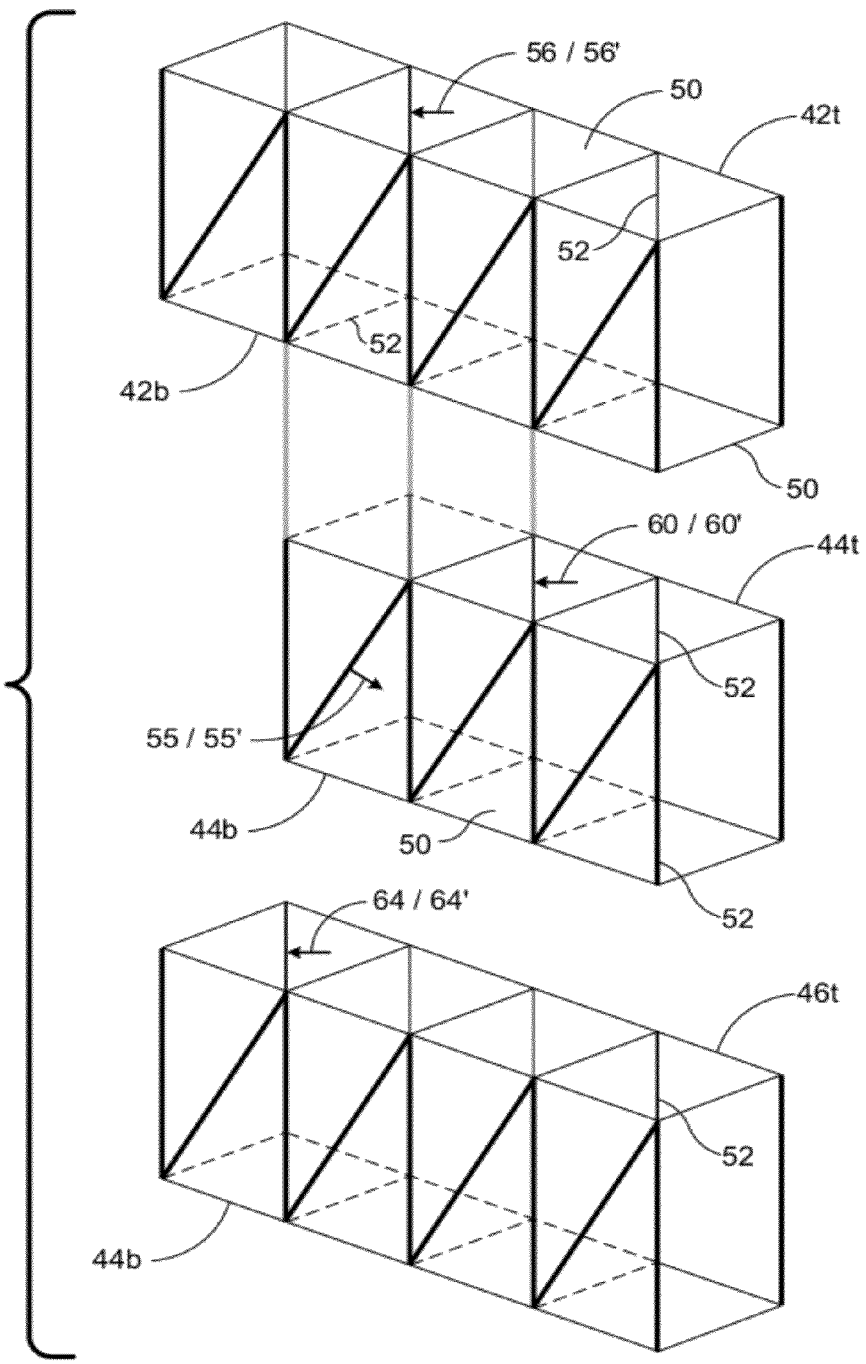
FIG. 4 shows an isolated perspective view of the discretized top and bottom layers of the conductors shown in FIGS. 3A-3C, with each discretized layer separated into a plurality of mesh elements.

FIG. 4 shows an isolated perspective view of the discretized top and bottom layers of the conductors shown in FIGS. 3A-3C, with each discretized layer separated into a plurality of mesh elements. With reference to FIG. 4 and with continuing reference to all previous figures, the method then advances to a step 206 wherein the conductive portion of each discrete circuit layer is discretized into a plurality of XY mesh elements 50 and XYZ mesh elements 51. A pair of adjacent mesh elements 50, or a pair of adjacent elements 51, or pair of adjacent elements 50 and 51, in each discrete layer define an edge 52 therebetween. In FIG. 4, each mesh element 50 and 51 is illustrated as having a triangular shape having the same size as each other mesh element 50 and 51. However, this is not to be construed as limiting the invention since the mesh elements 50 and 51 may have different shapes and/or different sizes. Triangular shaped mesh elements 50 and 51, however, are desirable since they offer high flexibility in modeling of complex geometries.

Next, the method advances to a step 208 wherein the portion of an exemplary current that flows across the edge 52 of each pair of mesh elements 50 or 50 and 51 in response to the application of the exemplary voltage(s) to circuit 30 is discretized into at least one discrete current vector element. More specifically, the exemplary voltage(s) applied to integrated circuit 30 is (are) discretized into exemplary discretized voltages (not shown) on layers 42-46. Utilizing these exemplary discretized voltages, the exemplary current that flows across the edge of each pair of mesh elements 50 or 50 and 51 and, hence, the at least one discrete current vector element that flows thereacross can be determined. For example, in FIG. 4, an edge 52 of a pair of mesh elements 50, or mesh elements 50 and 51, or a pair of mesh elements 51 in each discrete layer 42-46 includes a pair of discrete current vector element 55, 56, respectively, flowing thereacross as indicated by arrows in the figure.

The method then advances to a step 210 wherein at least one discrete scalar charge element, e.g., 55', 56', related to a derivative of the corresponding discrete current vector element, e.g., 55, 56 respectively, is determined.

Figure 5:
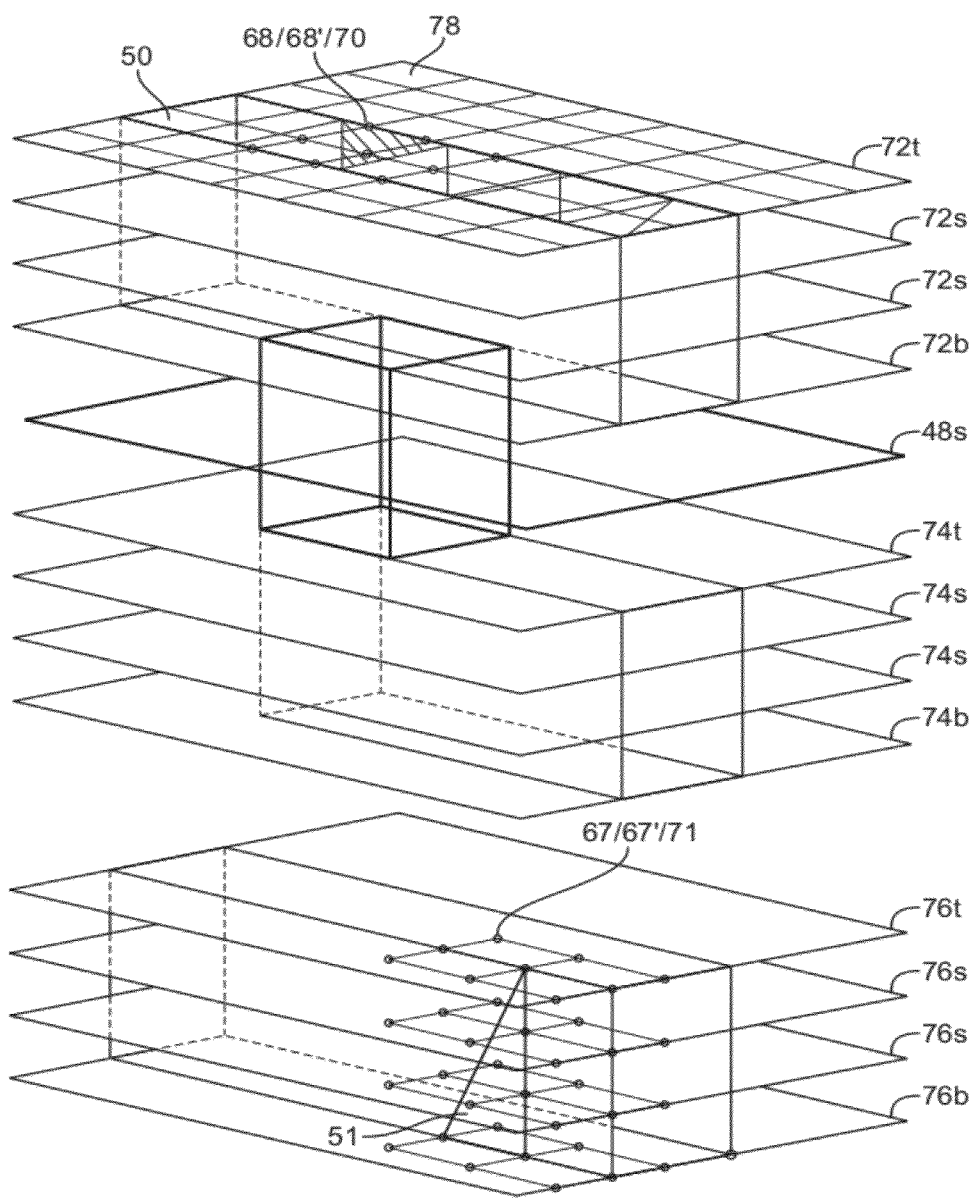
FIG. 5 shows a perspective view of each discretized layer and its mesh elements shown in FIG. 4 superimposed on a portion of a corresponding rectangular grid.

FIG. 5 shows a perspective view of each discretized layer and its mesh elements shown in FIG. 4 superimposed on a portion of a corresponding rectangular grid. With reference to FIG. 5 and with continuing reference to all previous figures, the method then advances to a step 212 wherein, for computational purposes, a rectangular grid is defined for each discrete circuit layer and via layer. The thus defined rectangular grids are arranged in the same spatial relationship as the corresponding discrete circuit layers. For example, rectangular grids 72t, 72b, 72s, 74t, 74b, 74s, 76t, 76b, 76s, and 48s are defined for discrete circuit layers 42, 44, 46 and via layer 48, respectively. Each rectangular grid 72t-76s includes a plurality of rectangular cells 78.

The method then advances to a step 214 wherein a plurality of discrete XY vector point sources 68 is determined for each XY discrete current vector element. Stated differently, each discrete XY vector element on top and bottom discrete layers 42t, 42b, 44t, 44b, 46t, 46b of circuit layers 42, 44, 46 is discretized into a plurality of discrete current vector point sources 68 on the corresponding rectangular grid 72t, 72b, 74t, 74b, 76t, 76b. Desirably, discrete XY vector point sources 68 associated with discrete XY current vector elements in adjacent mesh elements 50 are arranged to at least partially overlap each other. Each discrete vector point source 68 has a magnitude and a direction vector associated therewith.

The method then advances to a step 216 wherein a plurality of discrete XYZ vector point sources 67 is determined for each XYZ discrete current vector element. Stated differently, each discrete XYZ vector element on discrete layers 42, 44, 46 is discretized into a plurality of discrete XYZ current vector point sources 67 on the corresponding rectangular grid 72t, 72s, 72b, 74t, 74s, 74b, 76t, 76s, 76b. Desirably, discrete XYZ vector point sources 67 associated with discrete XYZ current vector elements in adjacent mesh elements 51 are arranged to at least partially overlap each other. Each discrete vector point source 67 has a magnitude and a direction vector associated therewith.

In the previous step 214, a plurality of discrete XY scalar point sources 68' is also determined for each XY discrete scalar charge element 56'. Stated differently, each XY scalar element on top and bottom discrete layers 42t, 42b, 44t, 44b, 46t, 46b of circuit layers 42, 44, 46 is discretized into a plurality of scalar points sources 68' on the corresponding rectangular grid. Desirably, discrete XY scalar point sources 68' associated with discrete XY scalar charge elements in adjacent mesh elements 50 are arranged to at least partially overlap each other. Each discrete XY scalar point source 68' has associated therewith a magnitude related to the electric charge associated with the scalar point source 68'.

In the current step 216, a plurality of discrete XYZ scalar point sources 67' is also determined for each XYZ discrete scalar charge element 55'. Stated differently, each XYZ scalar element on side walls of discrete layers 42s, 44s, 46s of circuit layers 42, 44, 46 is discretized into a plurality of scalar XYZ points sources 67' on the corresponding rectangular grids 72t, 72s, 72b, 74t, 74s, 74b, 76t, 76s, 76b. Similarly, each XYZ scalar element on side walls of via layers 48 is discretized into a plurality of scalar XYZ points sources 67' on the corresponding rectangular grids 72b, 48s, 74t. Desirably, discrete XYZ scalar point sources 68' associated with discrete XYZ scalar charge elements in adjacent mesh elements 51 are arranged to at least partially overlap each other. Each discrete XYZ scalar point source 67' has associated therewith a magnitude related to the electric charge associated with the scalar point source 67'.

Hereinafter, use of the adjective "discrete" preceding "current vector element(s)", "scalar charge element(s)", "vector point source(s)", and "scalar point source(s)" may be eliminated for simplicity. However, it is to be understood that each of these elements and sources are discrete and not continuous in a mathematical sense.

The vector point sources 67, 68 associated with each current vector element 55, 56, can be envisioned as a plurality of dipole antennae which are arranged in a manner whereupon the electromagnetic fields output by the antennae combine in a manner that would produce the same electromagnetic (em) field a certain threshold distance away from 55, 56 as 55, 56 would produce itself. The scalar point sources 67', 68' associated with each scalar charge element 55', 56' can be envisioned as a plurality of electric point charges that are arranged in a manner whereupon the electromagnetic fields output by the electric point charges 67', 68' combine in a manner that would produce the same electromagnetic (em) field as a certain threshold distance away from 55', 56' as 55', 56' would produce itself. The threshold distance may be determined as three time the minimum radius of a sphere enclosing all of the point sources 67, 68 or 67', 68' corresponding to the elements 55, 56 or 55', 56'.

Figure 6A:
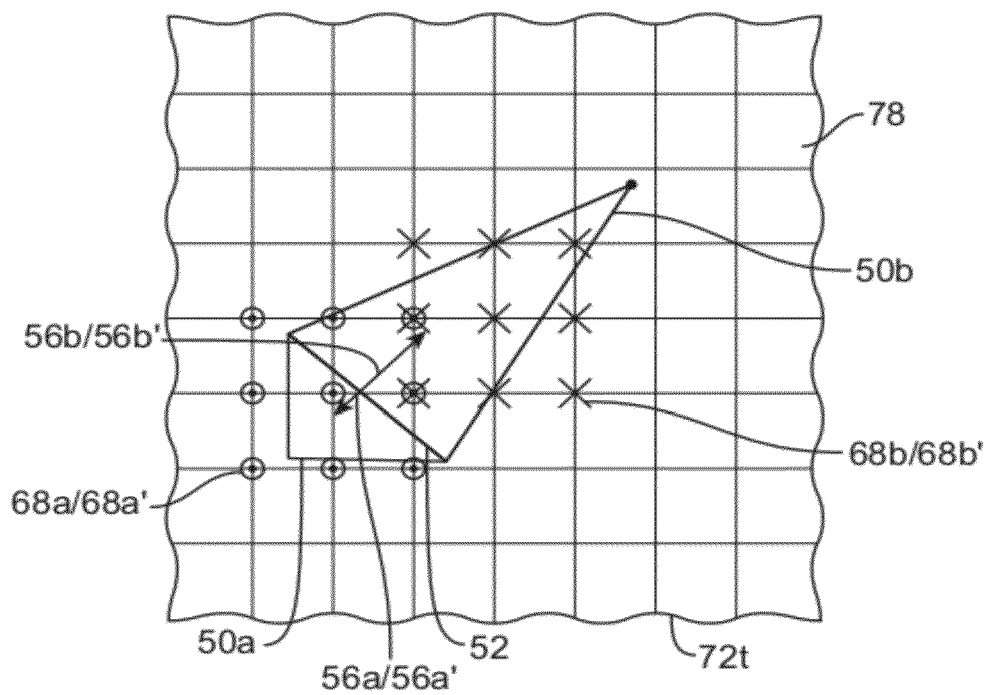
FIG. 6A shows an isolated view of a pair of mesh elements having a current vector element projected on a portion of one of the rectangular grids in FIG. 5 and corresponding vector point sources.
Figure 6B:
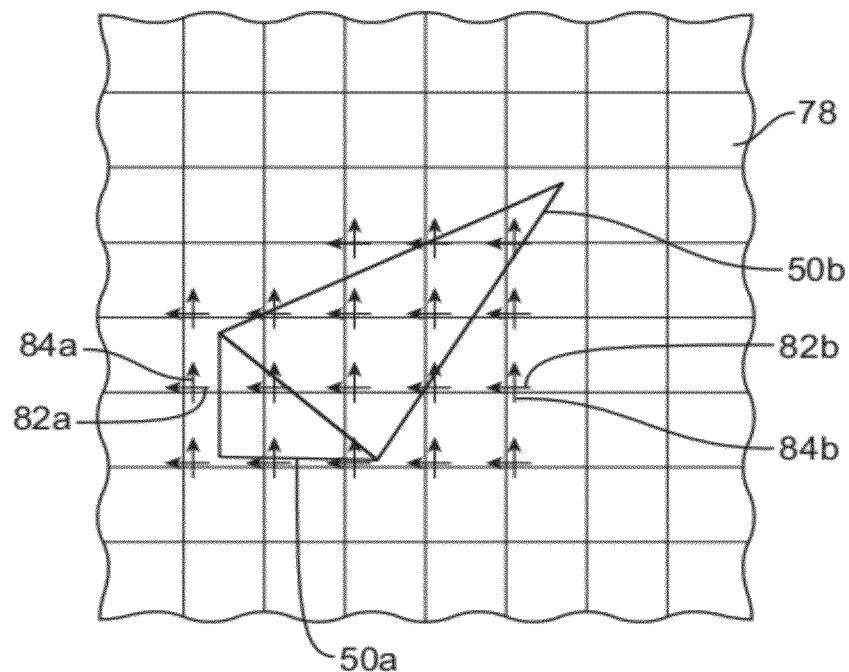
FIG. 6B shows a view of the pair of mesh elements shown in FIG. 6A with discretized vector point sources replacing the vector point source shown in FIG. 6A.
Figure 6C:
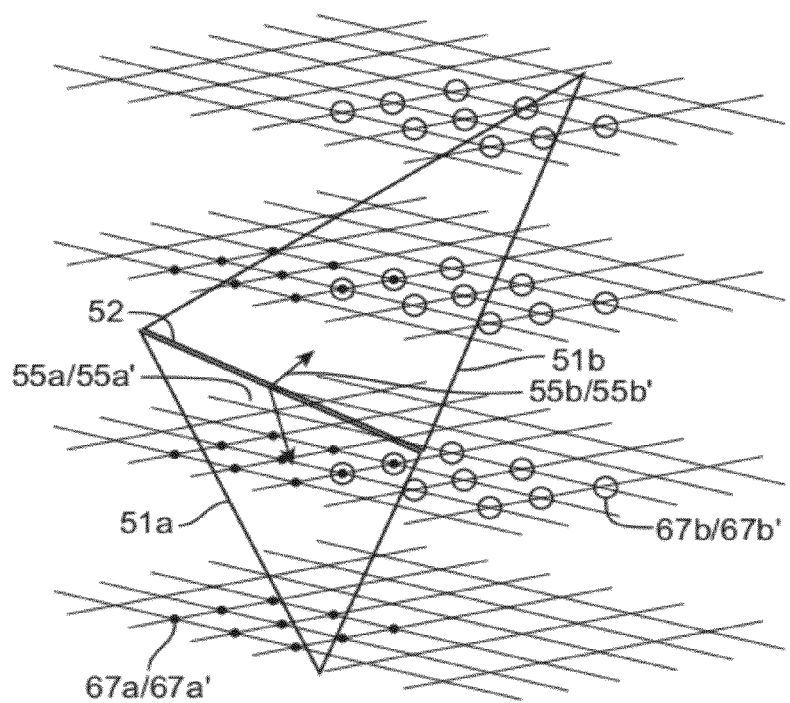
FIG. 6C shows a three-dimensional version of FIG. 6A.
Figure 6D:
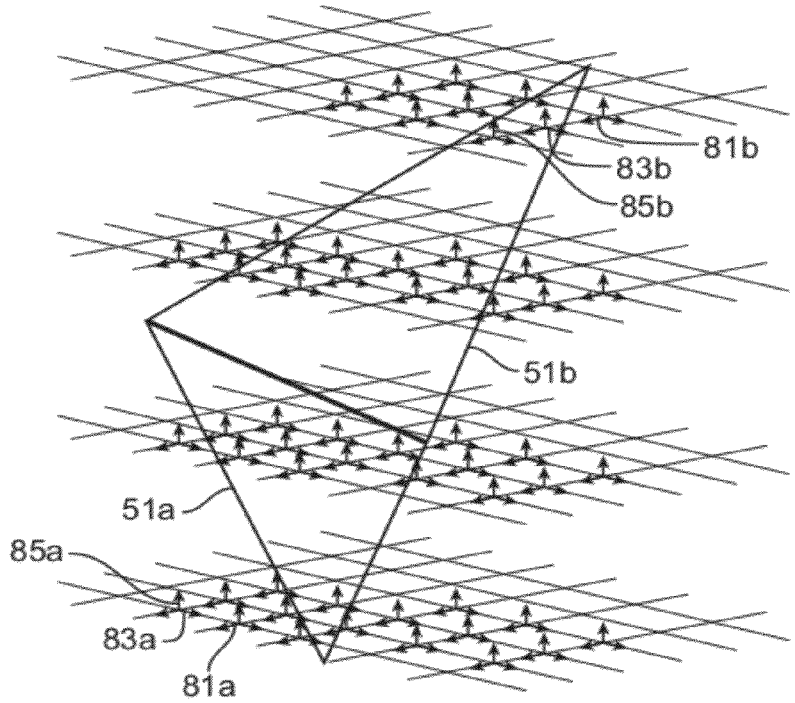
FIG. 6D shows a three-dimensional version of FIG. 6B.

FIGS. 6A-6C show discretizations of point sources on the grid. FIG. 6A shows an isolated view of a pair of mesh elements having a current vector element projected on a portion of one of the rectangular grids in FIG. 5 and corresponding vector point sources. FIG. 6B shows a view of the pair of mesh elements shown in FIG. 6A with discretized vector point sources replacing the vector point source shown in FIG. 6A. FIG. 6C shows a three-dimensional version of FIG. 6A, and FIG. 6D shows a three-dimensional version of FIG. 6B.

With reference to FIGS. 6A and 6B and with continuing reference to all previous figures, the XY vector point source(s) 68 associated with each XY current vector element, e.g., 56, are located on the corresponding rectangular grid in a predetermined spatial relation to the location of the corresponding XY current vector element on the corresponding layer. Similarly, the scalar point source(s) 68' associated with each XY scalar charge element, e.g., 56', are located on the corresponding rectangular grid in a predetermined spatial relation to the location of the corresponding XY scalar charge element on the corresponding layer. As shown in FIG. 6A and 6B, mesh elements 50 can be projected onto their corresponding rectangular grid without regard to the boundaries of the rectangular cells 78 comprising rectangular grid 72. FIGS. 6A and 6B also illustrate that each mesh element 50 can have a different size, with the size of each mesh element 50 being determined by the amount of resolution desired. For example, smaller size mesh elements 50 are utilized where greater resolution is required whereas larger size mesh elements 50 are utilized where less resolution is desired. The use of smaller and larger size mesh elements 50 helps improve computational efficiency by avoiding the use of two or more small size mesh elements 50 where a single large size mesh element 50 is sufficient.

FIG. 6A shows a subset of cells 78 of a portion of rectangular grid 72t having an isolated pair of adjacent mesh elements 50a and 50b that share an edge 52 having current vector elements 56 that flows thereacross and vector point sources 68a and 68b resulting from the effect of the flow of current vector element 56 in mesh element 50a and 50b, respectively. FIG. 6A also shows scalar point sources 68a' and 68b' resulting from scalar charge elements 56a' and 56b' determined from current vector elements 56a and 56b. For computational purposes, each vector point source 68 desirably overlays one of the scalar point sources 68'. However, this is not to be construed as limiting the invention since such overlay is not necessary.

FIG. 6B shows the same pair of mesh elements shown in FIG. 6A but with vector point source 68a and 68b replaced by x-oriented vector point sources 82a and 82b and y-oriented vector point sources 84a and 84b, respectively.

With reference to FIGS. 6C and 6D and with continuing reference to all previous figures, the XYZ vector point source(s) 67 associated with each XYZ current vector element, e.g., 55, are located on the corresponding rectangular grids in a predetermined spatial relation to the location of the corresponding XYZ current vector element on the corresponding circuit layer. Similarly, the scalar point source(s) 67' associated with each XYZ scalar charge element, e.g., 55', are located on the corresponding rectangular grid in a predetermined spatial relation to the location of the corresponding XYZ scalar charge element on the corresponding layers. As shown in FIGS. 6C and 6D, mesh elements 51 can be projected onto their corresponding rectangular grids without regard to the boundaries of the rectangular cells 78 comprising rectangular grids 72. FIGS. 6C and 6D also illustrate that each mesh element 51 can have a different size, with the size of each mesh element 51 being determined by the amount of resolution desired. For example, smaller size mesh elements 51 are utilized where greater resolution is required whereas larger size mesh elements 51 are utilized where less resolution is desired. The use of smaller and larger size mesh elements 51 helps improve computational efficiency by avoiding the use of two or more small size mesh elements 51 where a single large size mesh element 51 is sufficient.

FIG. 6C shows a subset of cells 78 of a portion of rectangular grids 72t, 72s, 72b having an isolated pair of adjacent mesh elements 51a and 51b that share an edge 52 having current vector elements 55a and 55b that flows thereacross and vector point sources 67a and 67b resulting from the effect of the flow of current vector element 55a and 55b in mesh element 51a and 51b, respectively. FIG. 6C also shows scalar point sources 67a' and 67b' resulting from scalar charge element 55a' and 55b' determined from current vector element 55a and 55b. For computational purposes, each vector point source 67 desirably overlays one of the scalar point sources 67'. However, this is not to be construed as limiting the invention since such overlay is not necessary.

FIG. 6D shows the same pair of mesh elements shown in FIG. 6C but with vector point source 67a and 67b replaced by x-oriented vector point sources 81a and 81b, y-oriented vector point sources 83a and 83b, and z-oriented vector point sources 85a and 85b, respectively.

The method then advances to a step 218, wherein a current spectrum of a first electromagnetic (em) field induced in each rectangular grid is determined from the vector point sources 67, 68 on the rectangular grid. More specifically, the current spectrum in each rectangular grid is determined by taking a two-dimensional (2D) Fourier transform, desirably a 2D fast Fourier transform (FFT), of the magnitudes of the vector point sources 67, 68 on the rectangular grid. As is well known in the art of electrical engineering, an electromagnetic field is produced in response to the flow of current in a conductor. In addition to interacting with the conductor in which the current flows, this electromagnetic field also propagates through substrate whereupon it can interact with other conductors on the same circuit layer or on other circuit layers.

Next, the method advances to a step 220 wherein, for each pair of rectangular grids, a discretized first vector electromagnetic field induced in one of the pair of rectangular grids (target grid) due to a single vector point source 67, 68 located at a predetermined point, e.g., the origin, on the other of the pair of rectangular grids (source grid) is determined. Desirably, the predetermined points on the rectangular grids are in alignment. The pairs of rectangular grids include each rectangular grid acting as both the target and the source grid. In addition, the pairs of rectangular grids include each rectangular grid acting as a target grid for each other rectangular grid, one-at-a-time, acting as a source grid.

For example, in FIG. 5 the discretized first vector electromagnetic field induced in rectangular (target) grid 72t due to a single vector point source 67, 68 located at the predetermined point on rectangular (source) grid 72t is determined. This discretized first vector electromagnetic field is represented in FIG. 5 by discrete points 70, 71 coincident with vector point sources 67, 68. Next, another discretized first vector electromagnetic field induced in rectangular (target) grid 72t due to a single vector point source 67, 68 located at the predetermined point on rectangular (source) grid 72s is determined. This process is repeated until a discretized first vector electromagnetic field induced in rectangular grid 72t, acting as the target grid, due to a single vector point source 67, 68 located at the predetermined point on each rectangular grid 72t, 72s, 72b, 48s, 74t, 74s, 74b, 76t, 76s, and 76b acting, one-at-a-time as a source grid is determined. This procedure is then repeated for each other rectangular grid, i.e., rectangular grids 72s, 72b, 48s, 74t, 74s, 74b, 76t, 76s, and 76b, acting as a target grid. Once this process is completed for the rectangular grids shown in FIG. 5, each rectangular grid will have thirteen instances of a discretized first vector electromagnetic field induced on the rectangular grid itself and on each of the other twelve other rectangular grids due to a single point source 67, 68 located at a predetermined point on the rectangular grid itself.

For computational purposes, each discrete point 70 of the discretized first vector electromagnetic field induced in each instance of each rectangular grid acting as the target grid desirably resides at the same point as a vector point source 67, 68. However, this is not to be construed as limiting the invention. The determination of the discretized first vector electromagnetic field induced in a target grid due to a single vector point source 67, 68 on a source grid is accomplished in a straightforward manner utilizing a dyadic Green's function which is well known in the art of electrical engineering.

Thereafter, the method advances to a step 222 wherein a two-dimensional (2D) Fourier transform, e.g., a 2D FFT, of dyadic components XX, XZ, YZ, ZX, ZY, and ZZ of each discretized first electromagnetic (em) field is taken to obtain a corresponding first vector electromagnetic field spectrum.

Next, the method advances to a step 224 wherein for each instance of each rectangular grid acting as the target grid of a pair of grids, the current spectrum determined for the rectangular grid is combined with the first vector electromagnetic field spectrum determined for said instance of the rectangular grid to obtain a spectrum of an induced vector field distribution matrix for said instance of the rectangular grid. More specifically, the spectrum of the induced vector field distribution matrix for each instance of the rectangular grid acting as the target grid of a pair of grids is determined by taking, on a cell-by-cell basis, a dot product of the current spectrum determined for the rectangular grid times the first vector electromagnetic field spectrum determined for said instance of the rectangular grid. As a result of taking the various dot products, each rectangular grid in FIG. 5 acting as a target grid of a pair of grids will have thirteen spectrums of induced vector field distribution matrices for each x-, y-, and z-components of first vector electromagnetic field spectrum associated therewith.

The method then advances to a step 226 wherein the spectrums of induced vector field distribution matrices associated with the instances of each rectangular grid acting as the target grid of a pair of grids are summed on a cell-by-cell basis to obtain a composite spectrum of induced vector field distribution matrices for said rectangular grid. For example, for the rectangular grids shown in FIG. 5, the spectrums of the induced vector field distribution matrices associated with the following pairs of rectangular grids are summed on a cell-by-cell basis for rectangular grid 72t acting as the target grid of each pair of rectangular grids: (72t, 72t), (72t, 72s) , (72t, 72b), (72t, 48s), (72t, 74t), (72t, 74s), (72t, 74b), (72t, 76t), (72t, 76s) and (72t, 76b). Similar comments apply in respect of combining the spectrums of the induced vector field distribution matrices associated with each other rectangular grid, i.e., rectangular grids 72s, 72b, 48s, 74t, 74s, 74b, 76t, 76s, and 76b, acting as the target grid of a pair of grids to obtain a corresponding composite spectrum of induced vector field distribution matrices therefor.

With reference to FIG. 7 and with continuing reference to all previous figures, the method advances to step 228 wherein an actual vector induced field matrix 90 is determined for each rectangular grid by taking an inverse Fourier transform, e.g., inverse 2D FFT, of the composite spectrum of induced vector field distribution matrices for the rectangular grid.

The actual vector induced field matrix 90 determined for each rectangular grid can be envisioned as having an outline conforming to the outline of the rectangular grid. Each cell of the actual vector induced field matrix 90 will include therein a field sample point 92 representing the electromagnetic field produced at the corresponding location on the rectangular grid as a result of the current flowing on all of the rectangular grids. More specifically, each field sample points 92 represents the electromagnetic field produced at the corresponding location as a result of the current vector elements on all of the rectangular grids. Field sample points 92 desirably coincide with vector point sources 67, 68. However, this is not to be construed as limiting the invention.

Figure 7A:
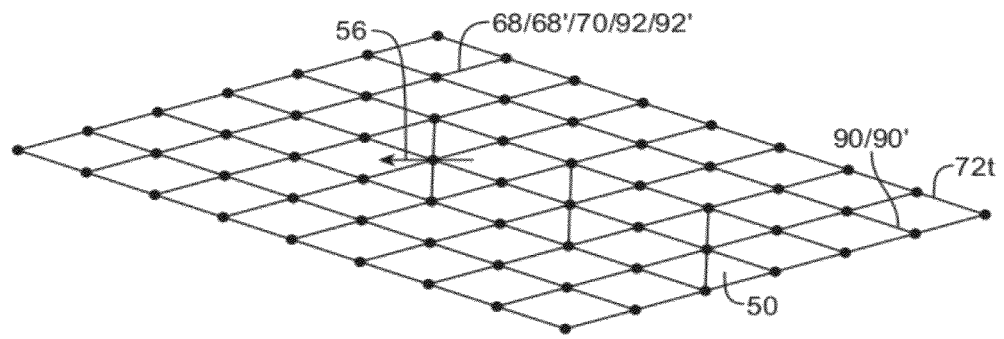
FIG. 7A shows a perspective view of an actual vector induced field matrix and an actual scalar induced field matrix on one of the rectangular grids shown in FIG. 5.

The method then advances to a step 230 wherein the voltage v1 induced at each XY current vector element, e.g., 56, on the rectangular grid is determined from the field sample points 92 of the actual vector induced field matrix 90 for said grid. FIG. 7A illustrates actual vector induced field matrix 90 superimposed on rectangular grid 72t including current vector element 56 superimposed thereon. Actual vector induced field matrix 90 includes field sample points 92 that correspond to the electromagnetic field produced at the corresponding locations on rectangular grid 72t. Utilizing the electromagnetic fields represented by field sample points 92, the voltage induced at each XY current vector element, e.g., 56, can be determined. Desirably, an array of 3×3 field sample points 92 surrounding each XY current vector element, e.g., 56, is utilized to determine the voltage induced thereat.

Figure 7B:
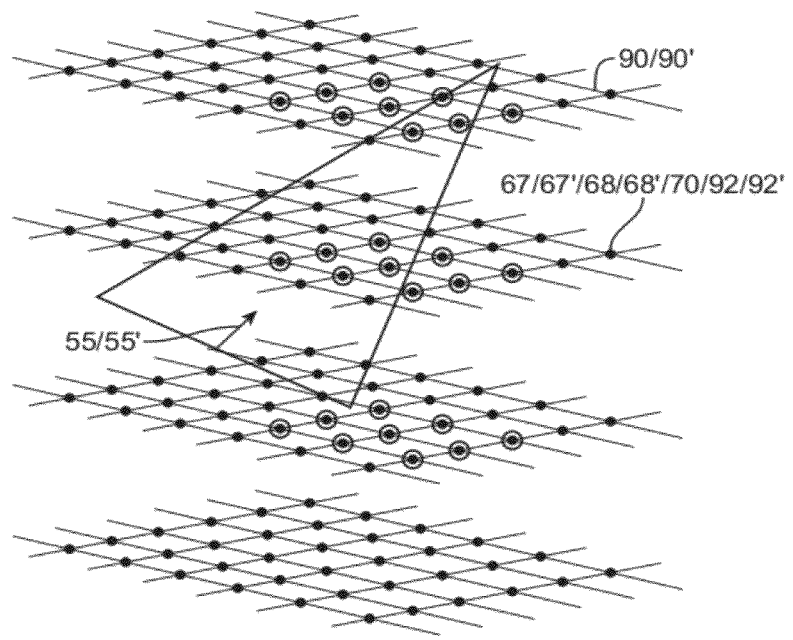
FIG. 7B shows a three-dimensional version of FIG. 7A.

The method then advances to a step 232 wherein the voltage v1 induced at each XYZ current vector element, e.g., 55 associated with grids 72t, 72s, 72b, is determined from the field sample points 90 of the actual vector induced field matrix 90 for said grids. FIG. 7B illustrates actual vector induced field matrices 90 superimposed on rectangular grids 72t, 72s, 72b, including current vector element 55 superimposed thereon.

Actual vector induced field matrices 90 includes field sample points 92 that correspond to the electromagnetic field produced at the corresponding locations on rectangular grids 72t, 72s, 72b. Utilizing the electromagnetic fields represented by field sample points 92, the voltage induced at each XYZ current vector element, e.g., 55, can be determined. Desirably, an array of 3×3×3 field sample points 92 surrounding each XYZ current vector element, e.g., 55, is utilized to determine the voltage induced thereat.

Desirably, the foregoing process for determining the actual vector induced field matrix 90 for each rectangular grid is performed separately for the x-oriented vector point sources 81, 82 of vector point sources 67, 68, for the y-oriented vector point sources 83, 84 of vector point sources 67, 68, and for the z-oriented vector point sources 85, of vector point sources 67. The x-oriented vector point sources 81, 82 will result in an actual x-oriented induced field matrix (not shown) and z-oriented induced field matrix. The y-oriented vector point sources 83, 84 will result in an actual y-oriented induced field matrix (not shown) and z-oriented induced field matrix. The z-oriented vector point sources 85 will result in an actual x-oriented induced field matrix (not shown), a y-oriented induced field matrix and a z-oriented induced field matrix. These seven field matrices can be summed together, on a cell-by-cell basis, to obtain the actual vector field induced matrix 90 on the rectangular grid from which the voltage produced at each current vector element, e.g., 55 and 56, on the rectangular grid can be determined.

The method then advances to a step 234 wherein a charge spectrum of a second em field induced in each rectangular grid is determined from the distribution of charges on the rectangular grid due to the scalar charge elements, e.g., 55' and 56', projected thereon.

In order to determine the distribution of charges on each rectangular grid, the magnitudes of the scalar point sources 67', 68' that overlap each other on the rectangular grid are summed together on the rectangular grid while the magnitudes of the scalar point sources 67', 68' that do not overlap retain their assigned magnitude on the rectangular grid. Once the magnitudes of the overlapping scalar point sources 67', 68' have been summed together on the rectangular grid, the magnitude at each point on the rectangular grid where a scalar point source 67' 68' resides represent the distribution of electric charges on the rectangular grid.

Utilizing this distribution of electric charges on each rectangular grid, the charge spectrum of the second em field induced in each rectangular grid is determined by taking a Fourier transform, e.g., a 2D FFT, of the distribution of charges on the rectangular grid.

Next, the method advances to a step a 236 wherein, for each pair of rectangular grids, a discretized second electromagnetic field induced in one of the pair of rectangular grids (target grid) due to a single scalar point source 67', 68' located at a predetermined location, e.g., the origin, on the other of the pair of rectangular grids (source grid) is determined. Since this procedure is similar to the procedure described above for determining for each pair of rectangular grids the discretized first vector electromagnetic field induced in one of the pair of rectangular grids (target grid) due to a single vector point source located at a predetermined location on the other of the pair of rectangular grids (source grid), a detailed description of this procedure is not included herein to avoid redundancy.

As discussed above, the pairs of rectangular grids include each rectangular grid acting as both the target grid and the source grid along with each rectangular grid acting as the target grid for each other rectangular grid acting as the source grid. As would be appreciated by one skilled in the art, the determination of the discretized second electromagnetic field induced in a target grid due to the single scalar point source 67', 68' located at the origin of a source grid is accomplished in a straightforward manner utilizing a Green's function well known in the art of electrical engineering.

The method then advances to a step 238 wherein a second electromagnetic field spectrum is determined for each instance of a discretized second electromagnetic field by taking a Fourier transform, e.g., 2D FFT, of the discretized second electromagnetic field.

The method then advances to a step 240 wherein, for each instance of each rectangular grid acting as the target grid of a pair of grids, the charge spectrum determined for the rectangular grid is combined with the second electromagnetic field spectrum determined for said instance of the rectangular grid to obtain for the rectangular grid a spectrum of an induced scalar field distribution matrix. More specifically, for each instance of each rectangular grid acting as the target grid of a pair of grids, a dot product is taken, on a cell-by-cell basis, of the charge spectrum for the rectangular grid times the second electromagnetic field spectrum for said instance of the rectangular grid to obtain therefor the spectrum of the induced scalar field distribution matrix. As a result of taking the various dot products, each rectangular grid in FIG. 5 acting as a target grid of a pair of grids will have thirteen spectrums of induced scalar field distribution matrices associated therewith, Next, the method advances to a step 242 wherein the spectrums of induced scalar field distribution matrices associated with the instances of each rectangular grid acting as a target grid of a pair of grids are combined, i.e., summed on a cell-by-cell basis, to obtain a composite spectrum of induced scalar field distribution matrices for the rectangular grid. Since this process is the same as a process described above for obtaining the composite spectrum of induced vector field distribution matrices, a detailed description of this process is not included herein to avoid redundancy.

The method then advances to a step 244 wherein, from the composite spectrum of the induced scalar field distribution matrices determined for each rectangular grid, an actual scalar induced field matrix 90' is determined for the rectangular grid by taking an inverse Fourier transform, e.g., an inverse 2D FFT, of the composite spectrum of induced scalar field distribution matrices for the rectangular grid.

Each actual scalar induced field matrix, 90' includes field sample points 92', each of which represents the electromagnetic field produced at the corresponding location on the rectangular grid due to the scalar point sources 67', 68' in all of the rectangular grids. Field sample points 92' desirably coincide with scalar point sources 67', 68'. However, this is not to be construed as limiting the invention.

The method then advances to a step 246 wherein, from the actual scalar induced field matrices 90' determined for each rectangular grid, the voltage v2 induced at each scalar charge element, e.g., 55'; 56', is determined from the field sample points 92' of the actual scalar induced field matrices 90'. More specifically, the voltage induced at each scalar charge element, e.g., 55' and 56', is determined by interpolating for the scalar charge element the effect of the electromagnetic field produced by each field sample point 92' on the rectangular grids.

The method then advances to a step 248 wherein the voltage v1 that was determined to be induced where each current vector element, e.g., 55 and 56, resides is summed with the voltage v2 that was determined to be induced where the corresponding scalar charge element, e.g., 55' and 56', resides to obtain a first voltage (V1) induced across the edge 52 of mesh elements 50 or 51 associated with the corresponding current vector element and scalar charge element.

Thereafter, the method shown in the flowchart of FIG. 1C advances to a step 250 wherein, a "pre-correction" is determined for each voltage V1 induced in a current vector element.

Figure 8:
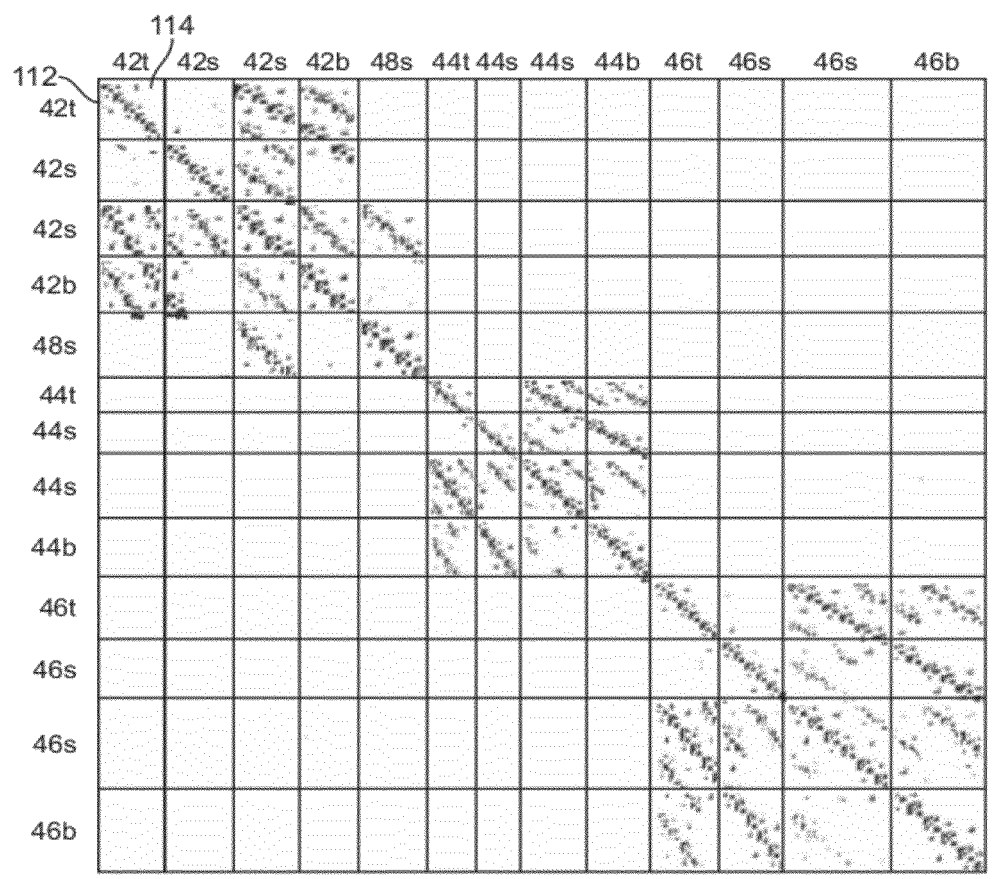
FIG. 8 shows a matrix of discretized layers versus discretized layers including elements where voltages determined prior to the application of a pre-correction have computational errors associated therewith.

FIG. 8 shows a matrix of discretized layers versus discretized layers including elements where voltages determined prior to the application of a pre-correction have computational errors associated therewith. With reference to FIG. 8, it has been observed that the first voltages (V1) determined in the above-described manner have computational errors associated therewith. Hence, these first voltages (V1) do not represent the actual voltages (AV) that have been induced at the corresponding locations on the discrete layers. FIG. 8 is a matrix 112 of discrete layers (42t-46b) versus discrete layers (42t-46b) including elements 114 wherein first voltages (V1) determined in the above-described manner have computational errors associated therewith. The abscissa of matrix 112 represents each discrete layer 42t-46b acting as a source layer whereas the ordinate axis of matrix 112 represents each discrete layer 42t-46b acting as the target layer.

To avoid these computational errors, a voltage induced across the edge 52 of each mesh element 50, 51 (target mesh element pair) due to the current vector elements and scalar charge elements residing on the edges of other mesh elements (source mesh elements) within a predetermined distance, i.e., the near field, of the target mesh elements (including the target mesh element itself acting as a source mesh element), is determined.

The voltages induced across the edge 52 of each mesh element due to current vector elements and scalar charge elements residing on the edges 52 of source mesh element pairs in the near field of the target mesh element pair are summed together to obtain a second voltage (V2) induced across the edge 52 of the target mesh element.

Next, a third voltage (V3) induced across the edge of each target mesh element pair is determined from the vector point sources 67, 68 and the scalar point sources 67', 68'. Specifically, for each point of each target mesh element where a vector point source 67, 68 and a scalar point source 67', 68' reside, the voltage induced at said point due to the field induced at said point by vector point sources 67, 68 and scalar point source 67', 68' of each source mesh element in the near field of said point is determined. (This includes the voltage induced at said point due to the field induced at said point by the vector point source 67, 68 and the scalar point source 67', 68' residing at said point). Once the voltage induced at each such point has been determined, the voltages induced at points associated with the edge of each target mesh element are summed together to obtain the third voltage (V3) induced across the edge of the target mesh element.

Next, the actual or pre-corrected voltage (AV) induced across the edge of each mesh elements is determined utilizing the following equation:

$$AV = V2 + (V1 - V3). \quad (1)$$

The method then advances to a step 252 wherein the actual voltage (AV) determined to be induced across the edge of each mesh element in the current iteration of the previous step 250 is compared to the voltage induced across said edge due to the application of the exemplary discretized voltage to integrated circuit 30 to determine whether they are within predetermined, acceptable tolerances of each other. If not, the method advances to a step 254 for determination of another new exemplary current flowing in each circuit layer of the multi-layer circuit based on the actual voltages determined for said circuit layer in the current iteration of the pre-correction step 250. Thereafter, the method advances to return step 256 for return to the start 202 and repetition of the subsequent steps 204-252. However, if it is determined in step 252 that the actual voltage determined to be induced across the edge of each pair of mesh elements in the current iteration of step 250 and the voltage induced across said edge due to the application of the exemplary discretized voltages are within acceptable tolerances of each other, the method advances to a stop step 58.

Specific algorithms related to the above-described method 200 will now be described in greater detail. The above-described method 200 determines a matrix-vector product solution for use with a full-wave electromagnetic (em) solver for multiple conductors 42-46 in multiple layers 32-36 of an integrated circuit design 30 or printed circuit board design. The em solver determines a method of moments (MoM) solution of the following mixed-potential integral equation:

$$\hat{n}(r) \times [-j\omega A(r) - \nabla\phi(r) - Z_s\{J(r)\} + E^i(r)] = 0, \ r \in S, \quad (2)$$

where $$A(r) = \int_S \overline{K^A}(r,r') \cdot J(r') ds', \quad (3a)$$

$$\phi(r) = \int_S \overline{K^\phi}(r,r') \nabla' \cdot J(r') ds, \quad (3b)$$

S = total area of the multi-layer circuit;
$E^i(r)$ = exemplary bias energizing the circuit;
$J(r)$ = exemplary current flow in the circuit layers;
$\overline{K^A} = \hat{x}\hat{x}K^{A,xx} + \hat{x}\hat{z}K^{A,xz} + \hat{y}\hat{y}K^{A,yy} + \hat{y}\hat{z}K^{A,yz} + \hat{z}\hat{x}K^{A,zx} + \hat{z}\hat{y}K^{A,zy} + \hat{z}\hat{z}K^{A,zz}$ = Dyadic Green's function;

$\dfrac{\nabla \cdot J(r)}{-j\omega}$ = scalar charge distribution corresponding to the current $J(r)$ flowing in the circuit layers;

$-j\omega A(r)$ = first electric field induced in a circuit layer due to the current $J(r)$ flowing in the circuit layers;
$-\nabla\phi(r)$ = second electric field induced in the circuit layer due to the scalar charges $$\dfrac{\nabla \cdot J(r)}{-j\omega}$$

in the circuit layers;
$-j\omega A(r) - \nabla\phi(r) - Z_S\{J(r)\}$ = the total induced electric field in the circuit layer;
$\hat{n}$ is a unit vector normal to the surface S; and
$\hat{n} \times E$ is operator defining the tangential component of an electric field vector E on S.

In equation (2), the tangential component of a total induced electric field cancels the tangential component of the electric field of the exemplary bias $E^i(r)$ on surface S. To solve equation (2), the current density on the surfaces are expanded by a set of basis functions of the type shown in the following equation:

$$J(r) \approx \Sigma_{n=1}^{N} J_n h_n(r) = \Sigma_{p=1}^{P} (\Sigma_{n=1}^{n_p} i_p^n b_p^n(r) + \Sigma_{n=1}^{N_p} I_p^n B_p^n(r)) = \bar{i} \cdot \bar{b} + \bar{I} \cdot \bar{B}, \quad (4)$$

where
$J(r)$ = exemplary current flow in the circuit layers;
$B_p^m(r)$, n=1, . . . , $N_p$; plurality of XYZ current vector elements on circuit layer p, e.g., 55, distributed throughout the circuit layers and defined on mesh elements 51; and $I_p^n$, n=1, ..., $N_p$; weights of XYZ current vector elements on pth circuit layer.

$b_p^m(r)$, n=1, ..., $n_p$; plurality of XY current vector elements on circuit layer p, e.g., 56, distributed throughout the circuit layers and defined on mesh elements 50; and $i_p^n$, n=1, ..., $n_p$; weights of XY current vector elements on pth circuit layer.

Desirably, the basis functions $f_n(r)$ in equation (4) are the Rao-Wilton-Glisson (RWG) basis function composed of:

a pair of XY and XY vector current elements $i_p^{n1} b_p^{n1}(r) + i_p^{n2} b_p^{n2}(r)$ located on the same circuit layer p or a pair of XY and XY vector current elements $i_{p1}^{n1} b_{p1}^{n1}(r) + i_{p2}^{n2} b_{p2}^{n2}(r)$ located different circuit layers p1 and p2 (forming implicit via described in U.S. Pat. No. 7,127,688 B2);

a pair of XY and XYZ vector current elements $i_p^{n1} b_p^{n1}(r) + I_p^{n2} B_p^{n2}(r)$ located on the same circuit layer p, or a pair of XY and XYZ vector current elements $i_{p1}^{n1} b_{p1}^{n1}(r) + I_{p2}^{n2} B_{p2}^{n2}(r)$ located different circuit layers p1 and p2, or a pair of XYZ and XYZ vector current elements $I_p^{n1} B_p^{n1}(r) + I_p^{n2} B_p^{n2}(r)$ located on the same circuit layer p, or a pair of XYZ and XYZ vector current elements $I_{p1}^{n1} B_{p1}^{n1}(r) + I_{p2}^{n2} B_{p2}^{n2}(r)$ located different circuit layers p1 and p2, 51 that have a common edge 52.

Combining vector current elements in the above described pairs offers high flexibility in modeling of complex geometries with arbitrary shapes. The resultant matrix equation after applying the MoM is given by the following general equation (5), which is the generalized form of the following equation (6):

$$\mathcal{Z} \cdot \mathcal{J} = \mathcal{V}, \quad (5)$$

where $\mathcal{V}$ is a vector of voltages induced in the plurality of RWG functions $f_n(r)$ formed by pairs of vector current elements, and J is a vector of coefficients for the plurality of RWG functions $h_n(r)$ formed by pairs of vector current elements.

Equation (6) can be viewed as a vector of voltages induced on all of the RWG basis functions $h_n(r)$ due to electromagnetic fields produced by all of the currents of the same RWG function $h_n(r)$. These electromagnetic interactions are fully described by the impedance matrix $\mathcal{Z}$. The matrix-vector product $\mathcal{Z} \cdot \mathcal{J}$ is computed iteratively until a desired degree of precision between two or more such computations is achieved for the true RWG weights $\mathcal{J}$.

Representation of each of the RWG function $h_n(r)$ defined on a pair of adjacent triangles in terms of two individual current vector elements associated the triangles casts the matrix equation (6) in the following form $$R^t \cdot Z \cdot R \cdot J = R^t \cdot U. \quad (6a)$$

Distinguishing the contributions in (5) associated with the XYZ and XY vector current elements to the first and second electric fields we rewrite (5) in the expanded form $$R^t \cdot \begin{bmatrix} \hat{A} + \hat{F} & \hat{a} + \hat{f} \\ A + F & a + f \end{bmatrix} \cdot \begin{bmatrix} I \\ i \end{bmatrix} = R^t \cdot \begin{bmatrix} U \\ u \end{bmatrix}, \quad (6b)$$

where I and i are vectors of unknown strength of XYZ and XY current elements, respectively; U, and u is plurality of voltages induced in the plurality of XYZ and XY current vector elements due to the total electromagnetic field produced thereat by all of the current vector elements, As discussed below, embodiments of the present invention efficiently determine voltages U and u induced on XYZ and XY elements discretizing the surface of multilayered circuit due to the presence of XYZ and XY current vector elements with magnitudes I and i flowing on the surface of conductor layers forming such circuit.

The impedance matrix element for interaction between current vector element (basis functions) can be expressed by the following equation (7):

$$\hat{Z}_{pp'}^{mn} = \hat{A}_{pp'}^{mn} + \hat{F}_{pp'}^{mn}, \ p,p'=0,\ldots,P, \ m=0,\ldots, \mathcal{N} \ n=0,\ldots,\mathcal{N} \quad (7a)$$

$$\hat{z}_{pp'}^{mn} = \hat{a}_{pp'}^{mn} + \hat{f}_{pp'}^{mn}, \ p,p'=0,\ldots,P, \ m=0,\ldots, \mathcal{N} \ n=0,\ldots,n \quad (7b)$$

$$i Z_{pp'}^{mn} = A_{pp'}^{mn} + F_{pp'}^{mn}, \ p,p'=0,\ldots,P, \ m=0,\ldots, n \ n=0,\ldots,\mathcal{N} \quad (7c)$$

$$z_{pp'}^{mn} = a_{pp'}^{mn} + f_{pp'}^{mn}, \ p,p'=0,\ldots,P, \ m=0,\ldots, n \ n=0,\ldots,n \quad (7d)$$

where $$\hat{A}_{pp'}^{mn} = \langle B_p^m, \langle \overline{K^A}, B_{p'}^n \rangle \rangle; \quad (8a)$$

$$\hat{a}_{pp'}^{mn} = \langle B_p^m, \langle \overline{K^A}, b_{p'}^n \rangle \rangle; \quad (8b)$$

$$A_{pp'}^{mn} = \langle b_p^m, \langle \overline{K^A}, B_{p'}^n \rangle \rangle; \quad (8c)$$

$$a_{pp'}^{mn} = \langle b_p^m, \langle \overline{K^A}, b_{p'}^n \rangle \rangle; \quad (8d)$$

$$\hat{F}_{pp'}^{mn} = \langle \nabla \cdot B_p^m, \langle K^\phi, \nabla' \cdot B_{p'}^n \rangle \rangle = \langle Q_p^m, \langle K^\phi, Q_{p'}^n \rangle \rangle; \quad (9a)$$

$$\hat{f}_{pp'}^{mn} = \langle \nabla \cdot B_p^m, \langle K^\phi, \nabla' \cdot b_{p'}^n \rangle \rangle = \langle Q_p^m, \langle K^\phi, q_{p'}^n \rangle \rangle; \quad (9b)$$

$$F_{pp'}^{mn} = \langle \nabla \cdot b_p^m, \langle K^\phi, \nabla' \cdot B_{p'}^n \rangle \rangle = \langle q_p^m, \langle K^\phi, Q_{p'}^n \rangle \rangle; \quad (9c)$$

$$f_{pp'}^{mn} = \langle \nabla \cdot b_p^m, \langle K^{100}, \nabla' \cdot b_{p'}^n \rangle \rangle = \langle q_p^m, \langle K^\phi, q_{p'}^n \rangle \rangle. \quad (9d)$$

In equations (8) and (9) we have:

$\nabla \cdot B_p^m$ = scalar XYZ charge element corresponding to the XYZ current vector element $B_p^m(r)$;

$\nabla \cdot b_p^m$ = scalar XY charge element corresponding to the XY current vector element $b_p^m(r)$.

Voltages are given as:

$\hat{A}_{pp'}^{mn}$, $\hat{F}_{pp'}^{mn}$ = voltages induced in the m-th XYZ current vector elements $B_p^m(r)$ located on circuit layer p due to the first and second em fields, respectively, produced by n-th XYZ current vector elements $B_{p'}^n(r)$ located on circuit layer p';

$\hat{a}_{pp'}^{mn}$, $\hat{f}_{pp'}^{mn}$ = voltages induced in the m-th XYZ current vector elements $B_p^m(r)$ located on circuit layer p due to the first and second em fields, respectively, produced by n-th XY current vector elements $b_{p'}^n(r)$ located on circuit layer p';

$A_{pp'}^{mn}$, $f_{pp'}^{mn}$ = voltages induced in the m-th XY current vector elements $b_p^m(r)$ located on circuit layer p due to the first and second em fields, respectively, produced by n-th XYZ current vector elements $B_{p'}^n(r)$ located on circuit layer p';

$a_{pp'}^{mn}$, $f_{pp'}^{mn}$ = voltages induced in the m-th XY current vector elements $b_p^m(r)$ located on circuit layer p due to the first and second em fields, respectively, produced by n-th XY current vector elements $b_{p'}^n(r)$ located on circuit layer p'.

Corresponding em fields are given as:

$\langle K^A, B_{p'}^n \rangle$ = first em field produced by the n-th XYZ current vector element $B_{p'}^n(r)$ located on circuit layer p';

$\langle K^A, b_{p'}^n \rangle$ = first em field produced by the n-th XY current vector element $b_{p'}^n(r)$ located on circuit layer p';

$\langle K^\phi, Q_{p'}^n \rangle$ = second em field produced by the n-th XYZ scalar charge element $\nabla \cdot B_{p'}^n(r)$ located on circuit layer p';

$\langle K^\phi, q_{p'}^n \rangle$ = second em field produced by the n-th XY scalar charge element $\nabla \cdot b_{p'}^n(r)$ located on circuit layer p'.

The terms $\hat{A}_{pp'}^{mn}$, $A_{pp'}^{mn}$, $\hat{a}_{pp'}^{mn}$, $a_{pp'}^{mn}$, and $\hat{F}_{pp'}^{mn}$, $F_{pp'}^{mn}$, $\hat{f}_{pp'}^{mn}$, $f_{pp'}^{mn}$ are operators of potentials A and φ on the p-th metal layer due to sources located on the p'-th metal layer.

Evaluation of the matrix-vector product Z·I can be accelerated if the translational invariance of the potentials A and φ is exploited. For this purpose, the current vector elements $B_p^m(r)$, e.g., 56, and their corresponding scalar charge elements $\nabla \cdot B_p^m(r)$, e.g., 56', (divergences) are projected on each rectangular grid, e.g., 72t, 72s, 72b, 48s, 74t, 74s, 74b, 76t, 76s and 76b.

In the following equations, for each XYZ current vector element (basis function) $B_p^m(r)$ and its corresponding XYZ scalar charge element (divergence) $\nabla \cdot B_p^m(r)$, as well as for each XY current vector element $b_p^m(r)$ and its corresponding XY scalar charge element (divergence) $\nabla \cdot b_p^m(r)$ only 𝕂 out of K point source for XYZ elements (𝕂<<K), and 𝕜 out of K point sources (𝕜<<K) for XY elements point sources have non-zero magnitudes.

$$B_p^m(r) \rightarrow \Sigma_{l=0}^{L_p-1} \Sigma_{k=0}^{K-1} \mathfrak{B}_{p,k,l}^m \delta(\rho-\rho_k)\delta(z-z_{p,l}),$$
$$\nabla \cdot B_p^m(r) = Q_p^m(r) \rightarrow \Sigma_{l=0}^{L_p-1} \Sigma_{k=0}^{K-1} \mathfrak{Q}_{p,k,l}^m \delta(\rho-\rho_k)\delta(z-z_{p,l}); \quad (10)$$

$$b_p^m(r) \rightarrow \Sigma_{k=0}^{K-1} \mathfrak{b}_{p,k}^m \delta(\rho-\rho_k),$$
$$\nabla \cdot b_p^m(r) = q_p^m(r) \rightarrow \Sigma_{k=0}^{K-1} \mathfrak{q}_{p,k}^m \delta(\rho-\rho_k). \quad (11)$$

In equations (10) and (11):

K=total number of nodes in each 2D rectangular grid;

k=0, ..., K−1=index of a node in the 2D rectangular grid;

$B_p^m(r)$=m-th XYZ current vector elements on a of mesh elements 51 located on the p-th metal layer;

$\mathfrak{B}_{p,k}^m$=coefficients of projection of $B_p^m(r)$ (weights of the vector point sources 67) on a rectangular grid;

$\nabla \cdot B_p^m(r)$=scalar charge element associated with the current vector element $B_p^m(r)$ on a mesh elements 51 located on the pth circuit layer;

$\mathfrak{Q}_{p,k}^m$=coefficients of projection of $\nabla \cdot B_p^m(r)$ (values of the scalar point sources 67') onto the rectangular grids;

$b_p^m(r)$=m-th XY current vector elements on a of mesh elements 50 located on the p-th metal layer;

$\mathfrak{b}_{p,k}^m$=coefficients of projection of current vector element $b_p^m(r)$ (weights of the vector point sources 68) on a rectangular grid;

$\nabla \cdot b_p^m(r)$=scalar charge element associated with the current vector element $b_p^m(r)$ on a mesh elements 50 located on the pth circuit layer;

$\mathfrak{q}_{p,k}^m$=coefficients of projection of $\nabla \cdot b_p^m(r)$ (values of the scalar point sources 68') onto the rectangular grids;

$\rho_k$=locations of the k-th vector point source 68 on 2D grid;

$z_{p,l}$=elevation of the l-th 2D grid associated with p-th circuit layer;

and

δ(r)=so-called δ-function which is equal to zero for any r≠0 (this a mathematical abstraction often used for description of point sources).

Substituting equation (10), (11) into equations (8) and (9), and using the filtering property of the δ-functions, the desired convolutional form of the matrix elements can be obtained as shown in the following equations (12) and (13)

$$\hat{\mathfrak{A}}_{pp'}^{mn} = \sum_{l=0}^{L_p-1} \sum_{k=0}^{K-1} \mathfrak{B}_{p,k,l}^m \cdot \sum_{l'=0}^{L_{p'}-1} \sum_{k'=0}^{K-1} \overline{K^A}(\rho_k-\rho_{k'}, z_{p,l}, z_{p',l'}) \cdot \mathfrak{B}_{p',k',l'}^n \quad (12a)$$
$$= \sum_{l=0}^{L_p-1} [\mathfrak{B}_{p,l}^m] \cdot \sum_{l'=0}^{L_{p'}-1} [\overline{K^A}_{pp',ll'}] \cdot [\mathfrak{B}_{p',l'}^n];$$

$$\hat{\mathfrak{a}}_{pp'}^{mn} = \sum_{l=0}^{L_p-1} \sum_{k=0}^{K-1} \mathfrak{B}_{p,k,l}^m \cdot \sum_{k'=0}^{K-1} \overline{K^A}(\rho_k-\rho_{k'}, z_{p,l}, z_{p',l'}) \cdot \mathfrak{b}_{p',k'}^n \quad (12b)$$
$$= \sum_{l=0}^{L_p-1} [\mathfrak{B}_{p,l}^m] \cdot [\overline{K^A}_{pp',ll'}] \cdot [\mathfrak{b}_{p'}^n]; l' = 0 \vee L_{p'}-1;$$

$$\mathfrak{A}_{pp'}^{mn} = \sum_{k=0}^{K-1} \mathfrak{b}_{p,k}^m \cdot \sum_{l'=0}^{L_{p'}-1} \sum_{k'=0}^{K-1} \overline{K^A}(\rho_k-\rho_{k'}, z_{p,l}, z_{p',l'}) \cdot \mathfrak{B}_{p',k',l'}^n \quad (12c)$$
$$= [\mathfrak{b}_p^m] \cdot \sum_{l'=0}^{L_{p'}-1} [\overline{K^A}_{pp',ll'}] \cdot [\mathfrak{B}_{p',l'}^n]; l = 0 \vee L_p-1;$$

$$\mathfrak{a}_{pp'}^{mn} = \sum_{k=0}^{K-1} \mathfrak{b}_{p,k}^m \cdot \sum_{k'=0}^{K-1} \overline{K^A}(\rho_k-\rho_{k'}, z_{p,l}, z_{p',l'}) \cdot \mathfrak{b}_{p',k'}^n \quad (12d)$$
$$= [\mathfrak{b}_p^m] \cdot [\overline{K^A}_{pp',ll'}] \cdot [\mathfrak{b}_{p'}^n]; l = 0 \vee L_p-1; l' = 0 \vee L_{p'}-1,$$

$$\hat{\mathfrak{F}}_{pp'}^{mn} = \sum_{l=0}^{L_p-1} \sum_{k=0}^{K-1} \mathfrak{Q}_{p,k,l}^m \cdot \sum_{l'=0}^{L_{p'}-1} \sum_{k'=0}^{K-1} K^\phi(\rho_k-\rho_{k'}, z_{p,l}, z_{p',l'}) \cdot \mathfrak{Q}_{p',k',l'}^n \quad (13a)$$
$$= \sum_{l=0}^{L_p-1} [\mathfrak{Q}_{p,l}^m] \cdot \sum_{l'=0}^{L_{p'}-1} [K^\phi_{pp',ll'}] \cdot [\mathfrak{Q}_{p',l'}^n],$$

$$\hat{\mathfrak{f}}_{pp'}^{mn} = \sum_{l=0}^{L_p-1} \sum_{k=0}^{K-1} \mathfrak{Q}_{p,k,l}^m \cdot \sum_{k'=0}^{K-1} K^\phi(\rho_k-\rho_{k'}, z_{p,l}, z_{p',l'}) \cdot \mathfrak{q}_{p',k'}^n \quad (13b)$$
$$= \sum_{l=0}^{L_p-1} [\mathfrak{Q}_{p,l}^m] \cdot [K^\phi_{pp',ll'}] \cdot [\mathfrak{q}_{p'}^n]; l' = 0 \vee L_{p'}-1;$$

$$\mathfrak{F}_{pp'}^{mn} = \sum_{k=0}^{K-1} \mathfrak{q}_{p,k}^m \cdot \sum_{l'=0}^{L_{p'}-1} \sum_{k'=0}^{K-1} K^\phi(\rho_k-\rho_{k'}, z_{p,l}, z_{p',l'}) \cdot \mathfrak{Q}_{p',k',l'}^n \quad (13c)$$
$$= [\mathfrak{q}_{p,k}^m] \cdot \sum_{l'=0}^{L_{p'}-1} [K^\phi_{pp',ll'}] \cdot [\mathfrak{Q}_{p',l'}^n]; l = 0 \vee L_p-1;$$

$$\mathfrak{f}_{pp'}^{mn} = \sum_{k=0}^{K-1} \mathfrak{q}_{p,k}^m \cdot \sum_{k'=0}^{K-1} K^\phi(\rho_k-\rho_{k'}, z_{p,l}, z_{p',l'}) \cdot \mathfrak{q}_{p',k'}^n \quad (13d)$$
$$= [\mathfrak{q}_p^m] \cdot [K^\phi_{pp',ll'}] \cdot [\mathfrak{q}_{p'}^n]; l = 0 \vee L_p-1;$$
$$l' = 0 \vee L_{p'}-1.$$

In equations (12) and (13) we have:

$[\overline{K^A}_{pp',ll'}] = \{\overline{K^A}(\rho_k-\rho_{k'}, z_{p,l}, z_{p',l'}): k=0, ..., K-1; k'=0, ..., K-1\}$=first vector electromagnetic field at point $\rho_k$ in rectangular grid l of circuit layer p produced by k'-th vector point source (dipole) located at $\rho_{k'}$ on the rectangular grid of circuit layer p' (this is the dyadic Green's function well known in the field of electrical engineering);

$[\mathcal{K}^A_{pp',ll'}] = \{K^A(\rho_k, z_{p,l}, z_{p',l'}): k=0, \ldots, K-1\}$ = matrix of the values of the Green's function at K points of the rectangular grid l of circuit layer p under the condition the point source $\rho_{k'}$ is located at the origin (k'=0) of the rectangular grid of circuit layer p';

$[\mathcal{B}_{p',l'}^n]$ = weights of the XYZ discrete current vector elements on a rectangular grid l' of circuit layer p' corresponding to the n-th XYZ current vector element located on circuit layer p';

$[\mathfrak{b}_{p'}^n]$ = weights of the XY discrete current vector elements on a rectangular grid 0 or $L_{p'}$ of circuit layer p' corresponding to the n-th XY current vector element located on circuit layer p'.

Further, in equations (12) and (13) we have:

$\Sigma_{l'=0}^{L_{p'}-1}[K^A_{pp',ll'}]\cdot[\mathcal{B}_{p',l'}^n]$ = the discretized first vector electromagnetic field induced in target rectangular grid l of circuit layer p due to n-th discrete XYZ source current vector element located on circuit layer p';

$\Sigma_{l'=0}^{l_{p'}-1}[K^A_{pp',ll'}]\cdot[\mathfrak{b}_{p'}^n]$ = the discretized first vector electromagnetic field induced in target rectangular grid l of circuit layer p due to n-th discrete XY source current vector element located on rectangular grids 0 or $L_{p'}$ of circuit layer p';

$\widehat{\mathfrak{A}}_{pp'}^{mn} = \Sigma_{l=0}^{L_p-1}[\mathcal{B}_{p,l}^m]\cdot\Sigma_{l'=0}^{L_{p'}-1}[K^A_{pp',ll'}]\cdot[\mathcal{B}_{p',l'}^n]$ = the voltage produced in the m-th discrete XYZ current vector element of pth circuit layer by the first vector electromagnetic field induced due to n-th discrete XYZ current vector element (associated with the XYZ current vector element) located on p'-th circuit layer;

$\widehat{\mathfrak{A}}_{pp'}^{mn} = [\mathfrak{b}_p^m]\cdot\Sigma_{l'=0}^{L_{p'}-1}[K^A_{pp',ll'}]\cdot[\mathcal{B}_{p',l'}^n]$ = the voltage produced in the m-th discrete XY current vector element located on l-th rectangular grid of pth circuit layer by the first vector electromagnetic field induced due to n-th discrete XYZ current vector element (associated with the XYZ current vector element) located on p'-th circuit layer;

$\hat{a}_{pp'}^{mn} = \Sigma_{l=0}^{L_p-1}[\mathcal{B}_{p,l}^m]\cdot[K^A_{pp',ll'}]\cdot[\mathfrak{b}_{p'}^n]$ = the voltage produced in the m-th discrete XYZ current vector element of p-th circuit layer by the first vector electromagnetic field induced due to n-th discrete XY current vector element (associated with the XY current vector element) located on l'-th rectangular grid of p'-th circuit layer;

$a_{pp'}^{mn} = [\mathfrak{b}_p^m]\cdot[K^A_{pp',ll'}]\cdot[\mathfrak{b}_{p'}^n]$ = the voltage produced in the m-th discrete XY current vector element located on l-th rectangular grid of p-th circuit layer by the first vector electromagnetic field induced due to n-th discrete XY current vector element (associated with the XY current vector element) located on l'-th rectangular grid of p'-th circuit layer.

Further, in equations (12) and (13) we have:

$[K^\Phi_{pp',ll'}] = \{K^\Phi(\rho_k-\rho_{k'}, z_{p,l}, z_{p',l'}): k=0, \ldots, K-1; k'=0, \ldots, K-1\}$ = second scalar electromagnetic field at point $\rho_k$ in rectangular grid l of circuit layer p produced by k'-th scalar point source located at $\rho_{k'}$ on the rectangular grid of circuit layer p' (this is the Green's function well known in the field of electrical engineering);

$[K^\Phi_{pp',ll'}] = \{K^\Phi(\rho_k, z_{p,l}, z_{p',l'}): k=0, \ldots, K\}$ = matrix of the values of the Green's function at K points of the rectangular grid l of circuit layer p under the condition the point source $\rho_{k'}$ is located at the origin (k'=0) of the rectangular grid of circuit layer p';

$[\mathfrak{Q}_{p',l'}^n]$ = weights of the XYZ discrete scalar charge elements on a rectangular grid l' of circuit layer p' corresponding to the n-th XYZ scalar charge element located on circuit layer p';

$[\mathfrak{q}_{p'}^n]$ = weights of the XY discrete scalar charge elements on a rectangular grid 0 or $L_{p'}$ of circuit layer p' corresponding to the n-th XY scalar charge element located on circuit layer p'.

Further, in equations (12) and (13) we have:

$\Sigma_{l'=0}^{L_{p'}-1}[K^\Phi_{pp',ll'}]\cdot[\mathfrak{Q}_{p',l'}^n]$ = the discretized second scalar electromagnetic field induced in target rectangular grid l of circuit layer p due to n-th discrete XYZ source scalar charge element located on circuit layer p';

$\Sigma_{l'=0}^{L_{p'}-1}[K^\Phi_{pp',ll'}]\cdot[\mathfrak{q}_{p'}^n]$ = the discretized second scalar electromagnetic field induced in target rectangular grid l of circuit layer p due to n-th discrete XY source scalar charge element located on rectangular grids 0 or $L_{p'}$ on circuit layer p';

$\widehat{\mathfrak{F}}_{pp'}^{mn} = \Sigma_{l=0}^{L_p-1}[\mathfrak{Q}_{p,l}^m]\cdot\Sigma_{l'=0}^{L_{p'}-1}[K^\Phi_{pp',ll'}]\cdot[\mathfrak{Q}_{p',l'}^n]$ = the voltage produced in the m th discrete XYZ scalar charge element of pth circuit layer by the second scalar electromagnetic field induced due to n-th discrete XYZ scalar charge element (associated with the XYZ scalar charge element) located on p'-th circuit layer;

$\widehat{\mathfrak{F}}_{pp'}^{mn} = [\mathfrak{q}_p^m]\cdot\Sigma_{l'=0}^{L_{p'}-1}[K^\Phi_{pp',ll'}]\cdot[\mathfrak{Q}_{p',l'}^n]$ = the voltage produced in the m-th discrete XY scalar charge element located on l-th rectangular grid of p-th circuit layer by the second scalar electromagnetic field induced due to n th discrete XYZ scalar charge element (associated with the XYZ scalar charge element) located on p'-th circuit layer;

$\hat{f}_{pp'}^{mn} = \Sigma_{l=0}^{L_p-1}[\mathfrak{Q}_{p,l}^m]\cdot[K^\Phi_{pp',ll'}]\cdot[\mathfrak{q}_{p'}^n]$ = the voltage produced in the m-th discrete XYZ scalar charge element of pth circuit layer by the second scalar electromagnetic field induced due to n-th discrete XY scalar charge element (associated with the XY scalar charge element) located on l'th rectangular grid of p'-th circuit layer;

$\hat{f}_{pp'}^{mn} = [\mathfrak{q}_p^m]\cdot[K^\Phi_{pp',ll'}]\cdot[\mathfrak{q}_{p'}^n]$ = the voltage produced in the m-th discrete XY scalar charge element located on l-th rectangular grid of p-th circuit layer by the second scalar electromagnetic field induced due to n-th discrete XY scalar charge element (associated with the XY scalar charge element) located on l'-th rectangular grid of p'-th circuit layer.

In equations (12) and (13), the hat (^) is utilized to distinguish the matrices computed through the projection of the current vector elements and the scalar charge elements on the rectangular grid. Matrix-vector products $[K^A_{pp',ll'}]\cdot[\mathcal{B}_{p',l'}^n]$, $[K^A_{pp',ll'}]\cdot[\mathfrak{b}_{p',l'}^n]$, $[K^\Phi_{pp',ll'}]\cdot[\mathfrak{Q}_{p'}^n]$, and $[K^\Phi_{pp',ll'}]\cdot[\mathfrak{q}_{p'}^n]$ are 2-dimensional (2D) convolutions and can be evaluated utilizing fast Fourier transforms (FFT) shown in the following equations (14) and (15):

$$[\overline{K^A}_{pp',ll'}]\cdot[\mathcal{B}_{p',l'}^n] = \qquad (14a)$$
$$\mathcal{F}^{-1}\{\mathcal{F}\{[\overline{K^A}_{pp',ll'}]\}\cdot\mathcal{F}\{[\mathcal{B}_{p',l'}^n]\}\} = \hat{x}\mathcal{F}^{-1}\{\mathcal{F}\{[K^{A,xx}_{pp',ll'}]\}\cdot$$
$$\mathcal{F}\{[\mathcal{B}_{p',l'}^{n,x}]\} + \mathcal{F}\{[K^{A,xz}_{pp',ll'}]\}\cdot\mathcal{F}\{[\mathcal{B}_{p',l'}^{n,z}]\}\} +$$
$$\hat{y}\mathcal{F}^{-1}\{\mathcal{F}\{[K^{A,yy}_{pp',ll'}]\}\cdot\mathcal{F}\{[\mathcal{B}_{p',l'}^{n,y}]\} +$$
$$\mathcal{F}\{[K^{A,yz}_{pp',ll'}]\}\cdot\mathcal{F}\{[\mathcal{B}_{p',l'}^{n,z}]\}\} +$$
$$\hat{z}\mathcal{F}^{-1}\{\mathcal{F}\{[K^{A,zx}_{pp',ll'}]\}\cdot\mathcal{F}\{[\mathcal{B}_{p',l'}^{n,x}]\} + \mathcal{F}\{[K^{A,zy}_{pp',ll'}]\}\cdot$$
$$\mathcal{F}\{[\mathcal{B}_{p',l'}^{n,y}]\} + \mathcal{F}\{[K^{A,zz}_{pp',ll'}]\}\cdot\mathcal{F}\{[\mathcal{B}_{p',l'}^{n,z}]\}\};$$

-continued $$[\overline{K^A}_{pp',ll'}] \cdot [\mathbf{b}^n_{p'}] = \mathcal{F}^{-1}\{\mathcal{F}\{[\overline{K^A}_{pp',ll'}]\} \cdot \mathcal{F}\{[\mathbf{b}^n_{p'}]\}\} = \quad (14b)$$
$$\hat{x}\mathcal{F}^{-1}\{\mathcal{F}\{[K^{A,xx}_{pp',ll'}]\} \cdot \mathcal{F}\{[\mathbf{b}^{n,x}_{p'}]\}\} +$$
$$\hat{y}\mathcal{F}^{-1}\{\mathcal{F}\{[K^{A,yy}_{pp',ll'}]\} \cdot \mathcal{F}\{[\mathbf{b}^{n,y}_{p'}]\}\} +$$
$$\hat{z}\mathcal{F}^{-1}\{\mathcal{F}\{[K^{A,zx}_{pp',ll'}]\} \cdot \mathcal{F}\{[\mathbf{b}^{n,x}_{p'}]\} + \mathcal{F}\{[K^{A,zy}_{pp',ll'}]\} \cdot \mathcal{F}\{[\mathbf{b}^{n,y}_{p'}]\}\};$$

$$[K^\phi_{pp',ll'}] \cdot [\mathfrak{Q}^n_{p'}] = \mathcal{F}^{-1}\{\mathcal{F}\{[K^\phi_{pp',ll'}]\} \cdot \mathcal{F}\{[\mathfrak{Q}^n_{p'}]\}\}; \quad (15a)$$

$$[K^\phi_{pp',ll'}] \cdot [\mathfrak{q}^n_{p'}] = \mathcal{F}^{-1}\{\mathcal{F}\{[K^\phi_{pp',ll'}]\} \cdot \mathcal{F}\{[\mathfrak{q}^n_{p'}]\}\}. \quad (15b)$$

In equations (14) and (15) we have:

$[K_{pp',ll'}^{A,xx}]$, $[K_{pp',ll'}^{A,yy}]$, $[K_{pp',ll'}^{A,xz}]$, $[K_{pp',ll'}^{A,zx}]$, $[K_{pp',ll'}^{A,yz}]$, $[K_{pp',ll'}^{A,zy}]$, $[K_{pp',ll'}^{A,zz}]$ = two-dimensional FFT (discrete spectra) of the dyadic Green's function samples in rectangular grid l of circuit layer p produced by point source located at the origin of the rectangular grid of circuit layer p';

$\mathcal{F}\{[\mathfrak{B}^n_{p',l'}]\}$ = two-dimensional FFT (discrete spectrum) of each discrete current vector element $[\mathfrak{B}^{n,x}_{p',l'}]$, $[\mathfrak{B}^{n,y}_{p',l'}]$, $[\mathfrak{B}^{n,z}_{p',l'}]$ on a rectangular grid l' of p'-th circuit layer corresponding to the n-th current vector element;

$[K^\Phi_{pp',ll'}]$ = two-dimensional FFT (discrete spectrum) of the second electromagnetic field induced in rectangular grid l of circuit layer p produced by point source located at the origin of the rectangular grid l' of circuit layer p'; and $\mathcal{F}\{[\mathfrak{q}^n_p]\}$ = two-dimensional FFT (discrete spectrum) of each discrete scalar charge element on a rectangular grid corresponding to the n-th scalar charge element on a rectangular grid l' of p'th circuit layer.

The dot products in equations (14) and (15) denote the element-by-element multiplication of the matrices of the same dimensions. The result of this dot-product is a matrix of the same dimension as the two matrices subjected to the product.

As a result, the matrix-vector product evaluated using projections of the XYZ and XY current vector elements $B_p^m(r)$, $b_p^m(r)$ and their corresponding scalar charge elements (divergences) $\nabla \cdot B_p^m(r)$, $\nabla \cdot b_p^m(r)$ on the rectangular grid takes on the form shown in the following equation (16):

$$\mathfrak{U}_p^m = (\hat{\mathfrak{A}}_p^m + \hat{\mathfrak{F}}_p^m) \cdot I + (\hat{\mathfrak{a}}_p^m + \mathfrak{f}_p^m) \cdot i = \quad (16a)$$
$$\sum_{l=0}^{L_p-1} [\mathfrak{B}^m_{p,l}] \cdot \mathcal{F}^{-1}\left\{\sum_{p'=0}^{P-1}\sum_{l'=0}^{L_{p'}-1} \mathcal{F}\{[\overline{K^A}_{pp',ll'}]\} \cdot \right.$$
$$\left. \mathcal{F}\left(\sum_{n=0}^{\mathcal{N}_{p'}-1}[\mathfrak{B}^n_{p',l'}]I^n_{p'} + \sum_{n=0}^{n_{p'}-1}[\mathfrak{b}^n_{p'}]i^n_{p'}\right)\right\} +$$
$$\sum_{l=0}^{L_p-1}[\mathfrak{Q}^m_{p,l}] \cdot \mathcal{F}^{-1}\left\{\sum_{p'=0}^{P-1}\sum_{l'=0}^{L_{p'}-1} \mathcal{F}\{[K^\phi_{pp',ll'}]\} \cdot \right.$$
$$\left. \mathcal{F}\left(\sum_{n=0}^{\mathcal{N}_{p'}-1}[\mathfrak{Q}^n_{p',l'}]I^n_{p'} + \sum_{n=0}^{n_{p'}-1}[\mathfrak{q}^n_{p'}]i^n_{p'}\right)\right\}$$
$$p = 0, \ldots, P-1; m = 0, \ldots, \mathcal{N}_p - 1;$$

$$\mathfrak{U}_p^m = (\mathfrak{A}_p^m + \mathfrak{F}_p^m) \cdot I + \quad (16b)$$
$$(\mathfrak{a}_p^m + \mathfrak{f}_p^m) \cdot i = [\mathfrak{b}_p^m] \cdot \mathcal{F}^{-1}\left\{\sum_{p'=0}^{P-1}\sum_{l'=0}^{L_{p'}-1} \mathcal{F}\{\overline{K^A}_{pp',ll'}\}\right\} \cdot$$
$$\mathcal{F}\left\{\sum_{n=0}^{\mathcal{N}_{p'}-1}[\mathfrak{B}^n_{p',l'}]I^n_{p'} + \sum_{n=0}^{n_{p'}-1}[\mathfrak{b}^n_{p'}]i^n_{p'}\right\} + [\mathfrak{q}^m_p] \cdot$$
$$\mathcal{F}^{-1}\left\{\sum_{p'=0}^{P-1}\sum_{l'=0}^{L_{p'}-1}\mathcal{F}\{[K^\phi_{pp',ll'}]\} \cdot\right.$$
$$\left. \mathcal{F}\left\{\sum_{n=0}^{\mathcal{N}_{p'}-1}[\mathfrak{Q}^n_{p',l'}]I^n_{p'} + \sum_{n=0}^{n_{p'}-1}[\mathfrak{q}^n_{p'}]i^n_{p'}\right\}\right\}$$
$$p = 0, \ldots, P-1; m = 0, \ldots, n_p - 1,$$

where $\mathcal{F}\{\ldots\}$ and $\mathcal{F}^{-1}\{\ldots\}$ denote forward and inverse 2D FFT operations respectively.

Further, we have:

$$\Sigma_{n=0}\mathcal{N}^{p'-1}[\mathfrak{B}_{p',l'}^n]\cdot I_{p'}^n + \Sigma_{n=0}n^{p'-1}[\mathfrak{b}_{p'}^n]\cdot i_{p'}^n \quad (16c)$$

=the current determined on the rectangular grid l' of circuit layer p' as the superposition of $\mathcal{N}_{p'}$ XYZ current vector element projection matrices $[\mathfrak{B}^n_{p',l'}]$ with weights $I_{p'}^n$ and $n_{p'}$ XY current vector element projection matrices $[\mathfrak{b}_{p'}^n]$ with weights $i_{p'}^n$;

$$\Sigma_{n=0}\mathcal{N}^{p'-1}[\mathfrak{Q}_{p',l'}^n]I_{p'}^n + \Sigma_{n=0}n^{p'-1}[\mathfrak{q}_{p'}^n]i_{p'}^n, \quad (16d)$$

=the charge determined on the rectangular grid l' of circuit layer p' as the superposition of $\mathcal{N}_{p'}$ XYZ charge scalar element projection matrices $[\mathfrak{Q}^n_{p',l'}]$ with weights $I_{p'}^n$ and $n_{p'}$ XY charge vector element projection matrices $[\mathfrak{q}_{p'}^n]$ with weights $i_{p'}^n$.

Further we have:

$$\mathcal{F}\{\Sigma_{n=0}\mathcal{N}^{p'-1}[\mathfrak{B}_{p',l'}^n]I_{p'}^n + \Sigma_{n=0}n^{p'-1}[\mathfrak{b}_{p'}^n]i_{p'}^n\} \quad (16e)$$

=the current spectrum determined on the rectangular grid l' of circuit layer p' as the spectrum of the superposition of $\mathcal{N}_{p'}$ XYZ current vector element projection matrices $[\mathfrak{B}^n_{p',l'}]$ with weights $I_{p'}^n$ and $n_{p'}$ XY current vector element projection matrices $[\mathfrak{b}_{p'}^n]$ with weights $i_{p'}^n$;

$$\mathcal{F}\{[\overline{K^A}_{pp',ll'}]\} \cdot \mathcal{F}\{\Sigma_{n=0}\mathcal{N}^{p'-1}[\mathfrak{B}_{p',l'}^n]\cdot I_{p'}^n + \Sigma_{n=0}$$
$$n^{p'-1}[\mathfrak{b}_{p'}^n]\cdot i_{p'}^n\} \quad (16f)$$

=the dot-product of the current spectrum $\mathcal{F}\{\Sigma_{n=0}\mathcal{N}^{p'-1}[\mathfrak{B}_{p',l'}^n]\cdot I_{p'}^n + \Sigma_{n=0} n^{p'-1}[\mathfrak{b}_{p'}^n]\cdot i_{p'}^n\}$ at the grid l' of circuit layer p' and dyadic Green's function spectrum $\mathcal{F}\{[\overline{K^A}_{pp',ll'}]\}$ translating the first em field effect of the current to the grid l of circuit layer p.

Further, we have:

$$\Sigma_{p'=0}^{P-1}\Sigma_{l'=0}^{L_{p'}-1}\mathcal{F}\{[\overline{K^A}_{pp',ll'}]\} \cdot \mathcal{F}\{\Sigma_{n=0}\mathcal{N}^{p'-1}[$$
$$\mathfrak{B}_{p',l'}^n]\cdot I_{p'}^n + \Sigma_{n=0}n^{p'-1}[\mathfrak{b}_{p'}^n]\cdot i_{p'}^n\} \quad (16g)$$

=composite spectrum of the first induced vector field distribution matrices obtained as a summation of the spectrums of the first induced field distributions on the cell-by-cell basis;

$$\mathcal{F}^{-1}\{\Sigma_{p'=0}^{P-1}\Sigma_{l'=0}^{L_{p'}-1}\mathcal{F}\{[\overline{K^A}_{pp',ll'}]\} \cdot \mathcal{F}\{\Sigma_{n=0}$$
$$\mathcal{N}^{p'-1}[\mathfrak{B}_{p',l'}^n]\cdot I_{p'}^n + \Sigma_{n=0}n^{p'-1}[\mathfrak{b}_{p'}^n]\cdot i_{p'}^n\}\} \quad (16h)$$

=the actual vector induced field matrix on grid l of circuit layer p obtained as the inverse Fourier transform of the composite spectrum (this is the combined first EM fields induced in that circuit layer by the currents $\sum_{n=0} \mathcal{N}^{p'-1}[\mathfrak{B}_{p',l'}{}^n]\cdot I_{p'}{}^n + \sum_{n=0} n^{p'-1}[\mathfrak{b}_{p'}{}^n]\cdot i_{p'}{}^n$, on source circuit layers p'=0, ..., P-1.

Further, we have:

$$\sum_{l=0}^{L_p-1} [\mathfrak{B}_{p,l}{}^m] \cdot \mathcal{F}^{-1} \{\sum_{p'=0}^{P-1} \sum_{l'=0}^{L_{p'}-1} \mathcal{F} \{[\overline{K^A}_{pp',ll'}]\} \cdot \mathcal{F} \{\sum_{n=0} \mathcal{N}^{p'-1} [\mathfrak{B}_{p',l'}{}^n] \cdot I_{p'}{}^n + \sum_{n=0} n^{p'-1} [\mathfrak{b}_{p'}{}^n] \cdot i_{p'}{}^n \}\} \quad (16i)$$

=voltage produced in the m-th XYZ current vector element of circuit layer p represented by matrix $[\mathfrak{B}_{p,l}{}^m]$ due to the combined first em fields induced in that layer by all the currents $\sum_{n=0} \mathcal{N}^{p'-1}[\mathfrak{B}_{p',l'}{}^n]\cdot I_{p'}{}^n + \sum n=0 n^{p'-1}[\mathfrak{b}_{p'}{}^n]\cdot i_{p'}{}^n$ on circuit layers p' p' from 0 through P-1;

$$[\mathfrak{b}_p{}^m] \mathcal{F}^{-1} \{\sum_{p'=0}^{P-1} \sum_{l'=0}^{L_{p'}-1} \mathcal{F} \{[\overline{K^A}_{pp',ll'}]\} \cdot \mathcal{F} \{\sum_{n=0} \mathcal{N}^{p'-1}[\mathfrak{B}_{p',l'}{}^n]\cdot I_{p'}{}^n + \sum_{n=0} n^{p'-1}[\mathfrak{b}_{p'}{}^n]\cdot i_{p'}{}^n \}\} \quad (16j)$$

=voltage produced in the m-th XY current vector element of circuit layer p represented by matrix $[\mathfrak{b}_p{}^m]$ due to the combined first em fields induced in that layer by all the currents $\sum_{n=0} \mathcal{N}^{p'-1}[\mathfrak{B}_{p',l'}{}^n]\cdot I_{p'}{}^n + \sum_{n=0} n^{p'-1}[\mathfrak{b}_{p'}{}^n]\cdot i_{p'}{}^n$ on circuit layers p' from 0 through P-1.

Further, we have:

$$\mathcal{F}\{\sum_{n=0} \mathcal{N}^{p'-1} [\mathfrak{Q}_{p',l'}{}^n] I_{p'}{}^n + \sum_{n=0} n^{p'-1} [\mathfrak{q}_{p'}{}^n] i_{p'}{}^n \} \quad (16k)$$

=the charge spectrum determined on the rectangular grid l' of circuit layer p' as the spectrum of the superposition of $\mathcal{N}_{p'}$ XYZ charge scalar element projection matrices $[\mathfrak{Q}_{p',l'}{}^n]$ with weights $I_{p'}{}^n$ and $n_{p'}$ XY charge vector element projection matrices $[\mathfrak{q}_{p'}{}^n]$ with weights $i_{p'}{}^n$;

$$\mathcal{F}\{[K_{pp',ll'}{}^\phi]\} \cdot \mathcal{F}\{\sum_{n=0} \mathcal{N}^{p'-1} [\mathfrak{Q}_{p',l'}{}^n]\cdot I_{p'}{}^n + \sum_{n=0} n^{p'-1} [\mathfrak{q}_{p'}{}^n] \cdot i_{p'}{}^n \} \quad (16l)$$

=the dot-product of the charge spectrum $\mathcal{F}\{\sum_{n=0} \mathcal{N}^{p'-1}[\mathfrak{Q}_{p',l'}{}^n]\cdot I_{p'}{}^n + \sum_{n=0} n^{p'-1}[\mathfrak{q}_{p'}{}^n]\cdot i_{p'}{}^n \}$ at the grid l' of circuit layer p' and scalar Green's function spectrum $\mathcal{F}\{[K_{pp',ll'}{}^\phi]\}$ translating the second em field effect of the charge to the grid l of circuit layer p.

Further, we have:

$$\sum_{p'=0}^{P-1} \sum_{l'=0}^{L_{p'}-1} \mathcal{F}\{[K_{pp',ll'}{}^\phi]\} \cdot \mathcal{F}\{\sum_{n=0} \mathcal{N}^{p'-1}[\mathfrak{Q}_{p',l'}{}^n]\cdot I_{p'}{}^n + \sum_{n=0} n^{p'-1}[\mathfrak{q}_{p'}{}^n]\cdot i_{p'}{}^n\} \quad (16m)$$

=composite spectrum of the second induced scalar field distribution matrices obtained as a summation of the spectrums of the second induced field distributions on the cell-by-cell basis;

$$\mathcal{F}^{-1}\{\sum_{p'=0}^{P-1} \sum_{l'=0}^{L_{p'}-1} \mathcal{F}\{[K_{pp',ll'}{}^\phi]\} \cdot \mathcal{F}\{\sum_{n=0} \mathcal{N}^{p'-1}[\mathfrak{Q}_{p',l'}{}^n]\cdot I_{p'}{}^n + \sum_{n=0} n^{p'-1}[\mathfrak{q}_{p'}{}^n]\cdot i_{p'}{}^n \}\} \quad (16n)$$

=the actual scalar induced field matrix on grid l of circuit layer p obtained as the inverse Fourier transform of the composite spectrum (this is the combined second EM fields induced in that circuit layer by the charges $\sum_{n=0} \mathcal{N}^{p'-1}[\mathfrak{Q}_{p',l'}{}^n]\cdot I_{p'}{}^n + \sum_{n=0} n^{p'-1}[\mathfrak{q}_{p'}{}^n]\cdot i_{p'}{}^n$ on source circuit layers p'=0, ..., P-1.

Further, we have:

$$\sum_{l=0}^{L_p-1} [\mathfrak{Q}_{p,l}{}^m] \cdot \mathcal{F}^{-1} \{\sum_{p'=0}^{P-1} \sum_{l'=0}^{L_{p'}-1} \mathcal{F}\{[K_{pp',ll'}{}^\phi]\} \cdot \mathcal{F}\{\sum_{n=0} \mathcal{N}^{p'-1}[\mathfrak{Q}_{p',l'}{}^n] I_{p'}{}^n + \sum_{n=0} n^{p'-1}[\mathfrak{q}_{p'}{}^n]\cdot i_{p'}{}^n\}\} \quad (16o)$$

=voltage produced in the m-th XYZ charge scalar element of circuit layer p represented by matrix $[\mathfrak{Q}_{p,l}{}^m]$ due to the combined second em fields induced in that layer by all the charges $\sum_{n=0} \mathcal{N}^{p'-1}[\mathfrak{Q}_{p',l'}{}^n]\cdot I_{p'}{}^n + \sum_{n=0} n^{p'-1}[\mathfrak{q}_{p'}{}^n]\cdot i_{p'}{}^n$ on circuit layers p' from 0 through P-1;

$$[\mathfrak{q}_p{}^m] \cdot \mathcal{F}^{-1}\{\sum_{p'=0}^{P-1} \sum_{l'=0}^{L_{p'}-1} \mathcal{F}\{[K_{pp',ll'}{}^\phi]\} \cdot \mathcal{F}\{\sum_{n=0} \mathcal{N}^{p'-1}[\mathfrak{Q}_{p',l'}{}^n]\cdot I_{p'}{}^n + \sum_{n=0} n^{p'-1}[\mathfrak{q}_{p'}{}^n] \cdot i_{p'}{}^n\}\} \quad (16p)$$

=voltage produced in the m-th XY charge vector element of circuit layer p represented by matrix $[\mathfrak{q}_p{}^m]$ due to the combined second em fields induced in that layer by all the charges $\sum_{n=0} \mathcal{N}^{p'-1}[\mathfrak{Q}_{p',l'}{}^n]\cdot I_{p'}{}^n + \sum_{n=0} n^{p'-1}[\mathfrak{q}_p{}^n]\cdot i_{p'}{}^n$ on circuit layers p' from 0 through P-1.

Further, we have:

$$\sum_{l=0}^{L_p-1}[\mathfrak{B}_{p,l}{}^m] \cdot \mathcal{F}^{-1}\{\sum_{p'=0}^{P-1}\sum_{l'=0}^{L_{p'}-1} \mathcal{F}\{[\overline{K^A}_{pp',ll'}]\} \cdot \mathcal{F}\{\sum_{n=0}\mathcal{N}^{p'-1}[\mathfrak{B}_{p',l'}{}^n]\cdot I_{p'}{}^n + \sum_{n=0} n^{p'-1}[\mathfrak{b}_{p'}{}^n]\cdot i_{p'}{}^n\}\} + \sum_{l=0}^{L_p-1}[\mathfrak{Q}_{p,l}{}^m] \cdot \mathcal{F}^{-1}\{\sum_{p'=0}^{P-1}\sum_{l'=0}^{L_{p'}-1} \mathcal{F}\{[K_{pp',ll'}{}^\phi]\} \cdot \mathcal{F}\{\sum_{n=0}\mathcal{N}^{p'-1}[\mathfrak{Q}_{p',l'}{}^n]\cdot I_{p'}{}^n + \sum_{n=0} n^{p'-1}[\mathfrak{q}_{p'}{}^n]\cdot i_{p'}{}^n\}\}$$
$$(p=0,\ldots,P-1; m=0,\ldots,\mathfrak{Q}_p-1) \quad (16q)$$

=superposition of the voltage induced in the m-th XYZ discrete current vector element due to the first em field (a current field) and in the m-th XYZ discrete scalar charge element due to the second em field (a charge field);

$$\sum_{l=0}^{L_p-1}[\mathfrak{b}_{p,l}{}^m] \cdot \mathcal{F}^{-1}\{\sum_{p'=0}^{P-1}\sum_{l'=0}^{L_{p'}-1} \mathcal{F}\{[\overline{K^A}_{pp',ll'}]\} \cdot \mathcal{F}\{\sum_{n=0}\mathcal{N}^{p'-1}[\mathfrak{B}_{p',l'}{}^n]\cdot I_{p'}{}^n + \sum_{n=0} n^{p'-1}[\mathfrak{b}_{p'}{}^n]\cdot i_{p'}{}^n\}\} + \sum_{l=0}^{L_p-1}[\mathfrak{q}_{p,l}{}^m] \cdot \mathcal{F}^{-1}\{\sum_{p'=0}^{P-1}\sum_{l'=0}^{L_{p'}-1} \mathcal{F}\{[K_{pp',ll'}{}^\phi]\} \cdot \mathcal{F}\{\sum_{n=0}\mathcal{N}^{p'-1}[\mathfrak{Q}_{p',l'}{}^n]\cdot I_{p'}{}^n + \sum_{n=0} n^{p'-1}[\mathfrak{q}_{p'}{}^n]\cdot i_{p'}{}^n\}\}$$
$$(p=0,\ldots,P-1; m=0,\ldots,\mathcal{N}_p-1) \quad (16r)$$

=superposition of the voltage induced in the m-th XY discrete current vector element due to the first em field (a current field) and in the m-th XY discrete scalar charge element due to the second em field (a charge field).

The point source representations of vector current elements in equations (10), (11) provide an accurate approximation of the matrix elements $\hat{A}_{pp'}{}^{mn}, A_{pp'}{}^{mn}, \hat{a}_{pp'}{}^{mn}, a_{pp'}{}^{mn}$ only when the n-th source current vector elements $B_{p'}{}^n(r), b_{p'}{}^n(r)$ are situated sufficiently far from the m-th current vector element (testing function) $B_p{}^m(r), b_p{}^m(r)$. The point source representations of scalar charge elements in equations (10), (11) provide an accurate approximation of the matrix elements $\hat{F}_{pp'}{}^{mn}, F_{pp'}{}^{mn}, \hat{f}_{pp'}{}^{mn}, f_{pp'}{}^{mn}$ only when the n-th source scalar charge elements $\nabla \cdot B_{p'}{}^n(r), \nabla \cdot b_{p'}{}^n(r)$ are situated sufficiently far from the m-th charge scalar elements $\nabla \cdot B_p{}^m(r), \nabla \cdot b_p{}^m(r)$. Therefore, pre-corrections $(\hat{\mathfrak{A}} \cdot I - \hat{\mathfrak{A}}^{near} \cdot I), (\mathfrak{a} \cdot i - \mathfrak{a}^{near} \cdot i), (\hat{\mathfrak{F}} \cdot I - \hat{\mathfrak{F}}^{near} \cdot I),$ and $(\hat{\mathfrak{f}} \cdot i - \hat{\mathfrak{f}}^{near} \cdot i)$ of the contributions into matrix-vector product (16a) and pre-corrections $(\hat{\mathfrak{A}} \cdot I - \hat{\mathfrak{A}}^{near} \cdot I), (\mathfrak{a} \cdot i - \mathfrak{a}^{near} \cdot i), (\hat{\mathfrak{F}} \cdot I - \hat{\mathfrak{F}}^{near} \cdot I),$ and $(\hat{\mathfrak{f}} \cdot i - \hat{\mathfrak{f}}^{near} \cdot i)$ into matrix-vector product (16a) and (16b) from the closely located current and charge elements is required.

In the following equations (17a) and (17b), matrix-vector products corresponding to the first vector electromagnetic field $\hat{A}^{near} \cdot I, \hat{a}^{near} \cdot i, A^{near} \cdot I, a^{near} \cdot i$ and matrix-vector products corresponding to the second electromagnetic field $\hat{F}^{near} \cdot I, \hat{f}^{near} \cdot i, F^{near} \cdot I, f^{near} \cdot i$ are evaluated directly as it is done in the conventional MoM (Method of Moments):

$$U = [\hat{A}^{near} \cdot I + (\hat{\mathfrak{A}} \cdot I - \hat{\mathfrak{A}}^{near} \cdot I)] + [\hat{a}^{near} \cdot i + (\mathfrak{a} \cdot i - \mathfrak{a}^{near} \cdot i)] + [\hat{F}^{near} \cdot I + (\hat{\mathfrak{F}} \cdot I - \hat{\mathfrak{F}}^{near} \cdot I)] + [\hat{f}^{near} \cdot i + (\hat{\mathfrak{f}} \cdot i - \hat{\mathfrak{f}}^{near} \cdot i)]; \quad (17a)$$

$$u = [A^{near} \cdot I + (\hat{\mathfrak{A}} \cdot I - \hat{\mathfrak{A}}^{near} \cdot I)] + [a^{near} \cdot i + (\mathfrak{a} \cdot i - \mathfrak{a}^{near} \cdot i)] + [F^{near} \cdot I + (\hat{\mathfrak{F}} \cdot I - \hat{\mathfrak{F}}^{near} \cdot I)] + [f^{near} \cdot i + (\hat{\mathfrak{f}} \cdot i - \hat{\mathfrak{f}}^{near} \cdot i)]. \quad (17b)$$

In equations (17a), (17b), we have:

$\hat{\mathfrak{A}}$ =the form of the first em field impedance matrix obtained as a result of the discretization of the XYZ source and XYZ observation current elements on the rectangular grids;

$\mathfrak{a}$ =the form of the first em field impedance matrix obtained as a result of the discretization of the XYZ source and XY observation current elements on the rectangular grids;

$\hat{\mathfrak{A}}$ = the form of the first em field impedance matrix obtained as a result of the discretization of the XY source and XYZ observation current elements on the rectangular grids;

$\mathfrak{a}$ = the form of the first em field impedance matrix obtained as a result of the discretization of the XY source and XY observation current elements on the rectangular grids;

$\hat{\mathfrak{F}}$ = the form of the second em field impedance matrix obtained as a result of the discretization of the XYZ source and XYZ observation charge elements on the rectangular grids;

$\hat{\mathfrak{f}}$ = the form of the second em field impedance matrix obtained as a result of the discretization of the XYZ source and XY observation charge elements on the rectangular grids;

$\mathfrak{F}$ = the form of the second em field impedance matrix obtained as a result of the discretization of the XY source and XYZ observation charge elements on the rectangular grids;

$\mathfrak{f}$ = the form of the second em field impedance matrix obtained as a result of the discretization of the XY source and XY observation charge elements on the rectangular grids.

Further, we have:

$\hat{A}^{near}$ = the matrix of near interactions with the element $\hat{A}_{pp'}^{mn,near}$ corresponding to correct partial voltage induced in XYZ vector current element m located on p-th circuit layer due to first em field produced by n-th XYZ vector current element located on p'-th circuit layer. The distance between the centers of these elements is smaller than a certain threshold;

$\hat{a}^{near}$ = the matrix of near interactions with the element $\hat{a}_{pp'}^{mn,near}$ corresponding to correct partial voltage induced in XYZ vector current element m located on p-th circuit layer due to first em field produced by n-th XY vector current element located on p'-th circuit layer. The distance between the centers of these elements is smaller than a certain threshold;

$A^{near}$ = the matrix of near interactions with the element $A_{pp'}^{mn,near}$ corresponding to correct partial voltage induced in XY vector current element m located on p-th circuit layer due to first em field produced by n-th XYZ vector current element located on p'-th circuit layer. The distance between the centers of these elements is smaller than a certain threshold;

$a^{near}$ = the matrix of near interactions with the element $a_{pp'}^{mn,near}$ corresponding to correct partial voltage induced in XY vector current element m located on p-th circuit layer due to first em field produced by n-th XY vector current element located on p'-th circuit layer. The distance between the centers of these elements is smaller than a certain threshold.

Further, we have:

$\hat{F}^{near}$ = the matrix of near interactions with the element $\hat{F}_{pp'}^{mn,near}$ corresponding to correct partial voltage induced in XYZ scalar charge element m located on p-th circuit layer due to second em field produced by n-th XYZ scalar charge element located on p'-th circuit layer. The distance between the centers of these elements is smaller than a certain threshold;

$\hat{f}^{near}$ = the matrix of near interactions with the element $\hat{f}_{pp'}^{mn,near}$ corresponding to correct partial voltage induced in XYZ scalar charge element m located on p-th circuit layer due to second em field produced by n-th XY scalar charge element located on p'-th circuit layer. The distance between the centers of these elements is smaller than a certain threshold;

$F^{near}$ = the matrix of near interactions with the element $F_{pp'}^{mn,near}$ corresponding to correct partial voltage induced in XY scalar charge element m located on p-th circuit layer due to second em field produced by n-th XYZ scalar charge element located on p'-th circuit layer. The distance between the centers of these elements is smaller than a certain threshold;

$f^{near}$ = the matrix of near interactions with the element $f_{pp'}^{mn,near}$ corresponding to correct partial voltage induced in XY scalar charge element m located on p-th circuit layer due to second em field produced by n-th XY scalar charge element located on p'-th circuit layer. The distance between the centers of these elements is smaller than a certain threshold.

Further, we have:

$\hat{\mathfrak{A}}^{near}$ = the matrix of near interactions with the element $\hat{\mathfrak{A}}_{pp'}^{mn,near}$ corresponding to the erroneous partial voltage induced in the discretized form of the XYZ current vector element m located on p-th circuit layer due to the first em field produced by the discretized form of the n-th XYZ current vector element located on p'-th circuit layer. The distance between the centers of these current element pairs is smaller than a certain threshold;

$\hat{\mathfrak{a}}^{near}$ = the matrix of near interactions with the element $\hat{\mathfrak{a}}_{pp'}^{mn,near}$ corresponding to the erroneous partial voltage induced in the discretized form of the XYZ current vector element m located on p-th circuit layer due to the first em field produced by the discretized form of the n-th XY current vector element located on p'-th circuit layer. The distance between the centers of these current element pairs is smaller than a certain threshold;

$\mathfrak{A}^{near}$ = the matrix of near interactions with the element $\mathfrak{A}_{pp'}^{mn,near}$ corresponding to the erroneous partial voltage induced in the discretized form of the XY current vector element m located on p-th circuit layer due to the first em field produced by the discretized form of the n-th XYZ current vector element located on p'-th circuit layer. The distance between the centers of these current element pairs is smaller than a certain threshold;

$\mathfrak{a}^{near}$ = the matrix of near interactions with the element $\mathfrak{a}_{pp'}^{mn,near}$ corresponding to the erroneous partial voltage induced in the discretized form of the XY current vector element m located on p-th circuit layer due to the first em field produced by the discretized form of the n-th XY current vector element located on p'-th circuit layer. The distance between the centers of these current element pairs is smaller than a certain threshold.

Further, we have:

$\hat{\mathfrak{F}}^{near}$ = the matrix of near interactions with the element $\hat{\mathfrak{F}}_{pp'}^{mn,near}$ corresponding to the erroneous partial voltage induced in the discretized form of the XYZ scalar charge element m located on p-th circuit layer due to the second em field produced by the discretized form of the n-th XYZ scalar charge element located on p'-th circuit layer. The distance between the centers of these charge element pairs is smaller than a certain threshold;

$\hat{\mathfrak{f}}^{near}$ = the matrix of near interactions with the element $\hat{\mathfrak{f}}_{pp'}^{mn,near}$ corresponding to the erroneous partial voltage induced in the discretized form of the XYZ scalar charge element m located on p-th circuit layer due to the second em field produced by the discretized form of the n-th XY scalar charge element located on p'-th circuit layer. The distance between the centers of these charge element pairs is smaller than a certain threshold;

$\mathfrak{F}^{near}$ = the matrix of near interactions with the element $\mathfrak{F}_{pp'}^{mn,near}$ corresponding to the erroneous partial voltage induced in the discretized form of the XY scalar charge element m located on p-th circuit layer due to the second em field produced by the discretized form of the n-th XYZ scalar charge element located on p'-th circuit layer. The distance between the centers of these charge element pairs is smaller than a certain threshold;

$\hat{f}^{near}$=the matrix of near interactions with the element $\hat{f}_{pp'}^{mn,near}$ corresponding to the erroneous partial voltage induced in the discretized form of the XY scalar charge element m located on p-th circuit layer due to the second em field produced by the discretized form of the n-th XY scalar charge element located on p'-th circuit layer. The distance between the centers of these charge element pairs is smaller than a certain threshold.

Further, we have:

[$\hat{A}^{near} \cdot I + (\hat{\mathfrak{A}} \cdot I - \hat{\mathfrak{A}}^{near} \cdot I)$]=the compensation for the erroneous first field interactions between near XYZ source and XYZ target current vector elements in the matrix-vector product U;

[$\hat{a}^{near} \cdot i + (\mathfrak{a} \cdot i - \mathfrak{a}^{near} \cdot i)$]=the compensation for the erroneous first field interactions between near XY source and XYZ target current vector elements in the matrix-vector product U;

[$\hat{F}^{near} \cdot I + (\hat{\mathfrak{F}} \cdot I - \hat{\mathfrak{F}}^{near} \cdot I)$]=the compensation for the erroneous second field interactions between near XYZ source and XYZ target scalar charge elements in the matrix-vector product U;

[$\hat{f}^{near} \cdot i + (\hat{\mathfrak{f}} \cdot i - \hat{\mathfrak{f}}^{near} \cdot i)$]=the compensation for the erroneous second field interactions between near XY source and XYZ target scalar charge elements in the matrix-vector product U;

[$A^{near} \cdot I + (\mathfrak{A} \cdot I - \mathfrak{A}^{near} \cdot I)$]=the compensation for the erroneous first field interactions between near XYZ source and XY target current vector elements in the matrix-vector product u;

[$a^{near} \cdot i + (\mathfrak{a} \cdot i - \mathfrak{a}^{near} \cdot i)$]=the compensation for the erroneous first field interactions between near XY source and XY target current vector elements in the matrix-vector product u;

[$F^{near} \cdot I + (\mathfrak{F} \cdot I - \mathfrak{F}^{near} \cdot I)$]=the compensation for the erroneous second field interactions between near XYZ source and XY target scalar charge elements in the matrix-vector product u;

[$f^{near} \cdot i + (\mathfrak{f} \cdot i - \mathfrak{f}^{near} \cdot i)$]=the compensation for the erroneous second field interactions between near XY source and XY target scalar charge elements in the matrix-vector product u.

Figure 9:
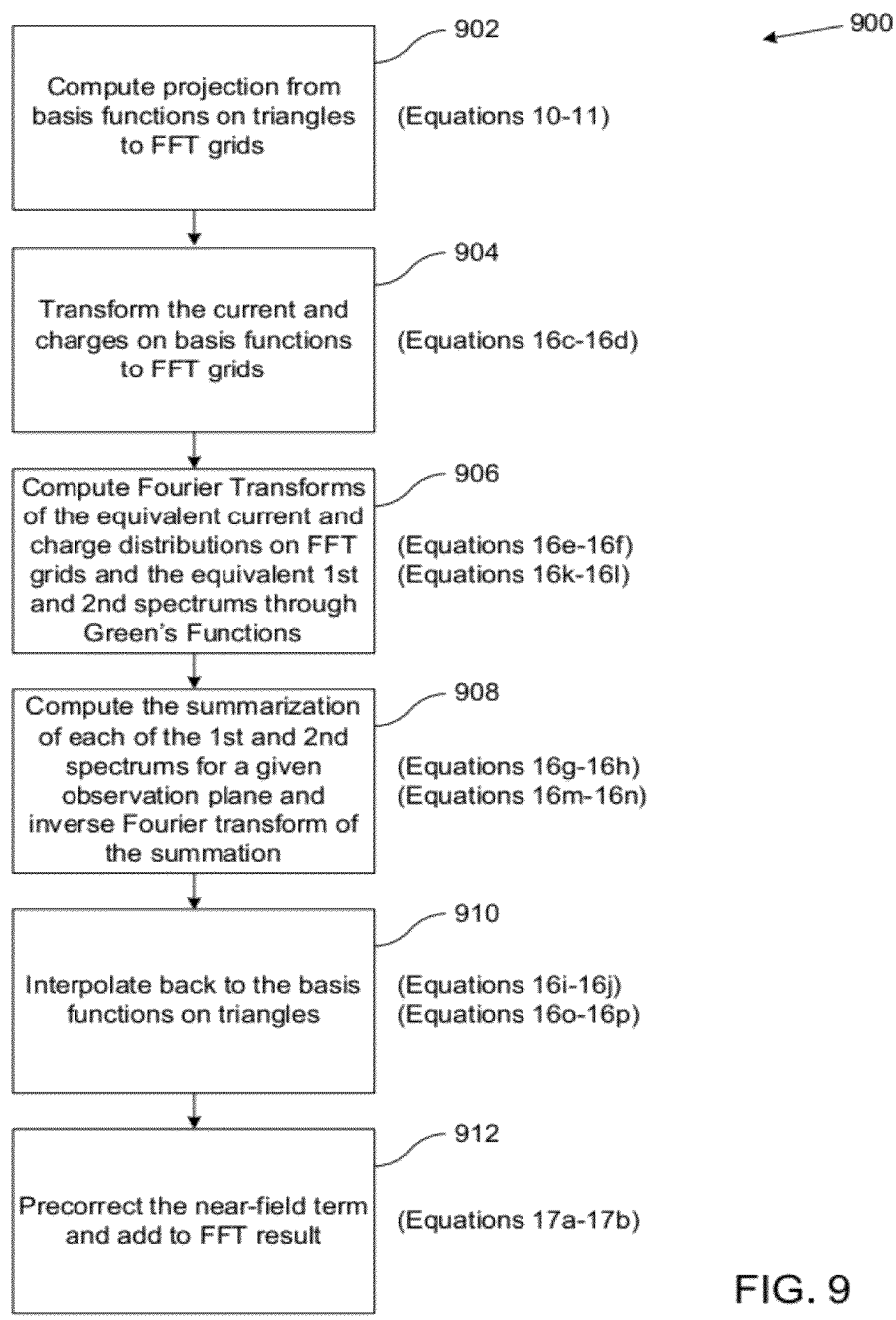
FIG. 9 shows a method of modeling a multi-layer IC for an embodiment of the present invention.

In accordance with an embodiment of the present invention, FIG. 9 shows a method of modeling a circuit 900 where the above-described formulas are summarized. First, compute the projection from basis functions on triangles to FFT grids 902. This includes computing the projection from the current vector elements and corresponding scalar charge elements (basis functions on triangle pairs) to a two-dimensional rectangular grid for each plane. (cf. equations (10)-(11).) Next transform the current and charges on basis functions to FFT grids 904. (cf. equations (16c)-(16d).) Next, compute Fourier transforms of the equivalent current and charge distributions on the FFT grids and the equivalent first and second spectrums through the Green's functions 906. (cf. equations (16e)-(16f) for current spectrum, equations (16k)-(16l) for charge spectrum.) Next compute the summation of each of the first and second spectrums for a given observation plane and inverse Fourier transform of the summation 908. This includes computing the summation of the first spectrum for a given observation plane and computing the inverse Fourier transform of the summation of the first spectrum. (cf. equations (16g)-(16h).) This also includes computing the summation of the second spectrum for a given observation plane and computing the inverse Fourier transform of the summation of the second spectrum. (cf. equations (16m)-(16n).) Next interpolate back to the basis functions on triangles 910. (cf. equations (16i)-(16j) for current vectors and equations (16o)-(16p) for charges.) Finally pre-correct the near field term and add to the FFT result. (cf. equations (17a)-(17b).)

Figure 10:
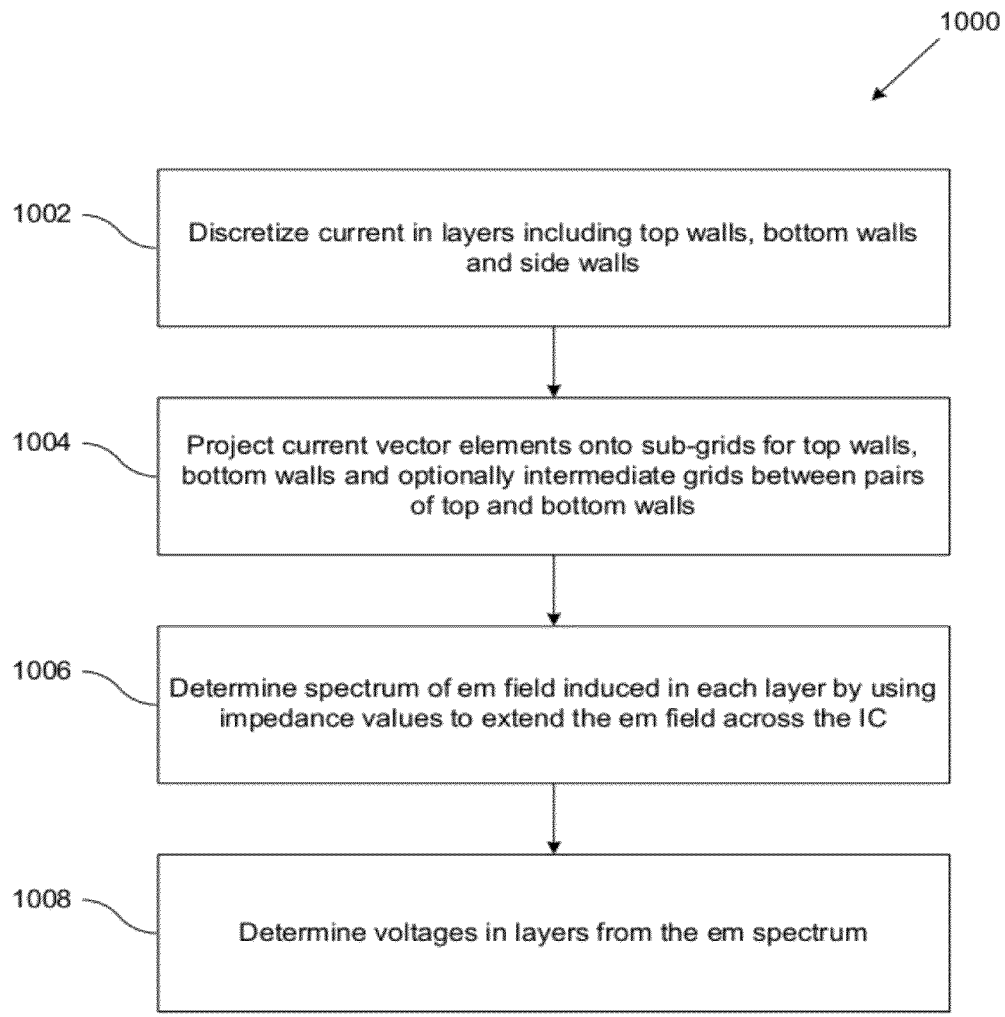
FIG. 10 shows a method of modeling a multi-layer IC for an embodiment of the present invention.

FIG. 10 shows a method 1000 of modeling a multi-layer IC for a related embodiment. First, discretize the current in the layers including top walls, bottom walls and sidewalls 1002. Next project current vector elements onto sub-grids for top walls, bottom walls and (optionally) intermediate grids between pairs of top and bottom walls 1004. Next determine the spectrum of the em field induced in each layer by using impedance values to extend the em field across the IC 1006. Next determine voltages in layers from the em spectrum 1008.

Equations (17a)-(17b) provide a more detailed formula for equation (1), which shows how the actual voltage (AV) can be represented as contribution from nearby mesh element pairs (V2) plus a contribution from far-away mesh element pairs (V1) minus a pre-correction value (V3) that corresponds to a correction between the two models (i.e., a grid model and a mesh model). In some operational settings, it may be desirable to store model values for the circuit (e.g., parameters of equations (17a)-(17b)) so that, for given current values, voltage values can be computed by means of the circuit-model values. In some operational settings, these circuit-model values can be updated when the circuit design changes incrementally as in "Incremental Solver for Modeling an Integrated Circuit," U.S. patent application Ser. No. 11/601,601, filed Nov. 17, 2006, which is incorporated by reference in its entirety. In some operational settings, these circuit-model values can be assembled from a library of characteristic model elements as in "Library-based Solver for Modeling an Integrated Circuit," U.S. patent application Ser. No. 11/601,573, filed Nov. 17, 2006, which is incorporated by reference in its entirety.

According to this approach, interactions between nearby mesh elements are modeled by the direct values, and interactions between far-away mesh elements are modeled by indirect values. That is, pairs of mesh elements are designated as nearby or far-away (e.g., based on some threshold distance value) so that there interactions (e.g., impedance relationships) can be modeled accordingly. For example, in many operational settings it is preferable to use a simple "nearest neighbors" rule where directly neighboring mesh-element pairs (e.g., sharing at least a point or an edge) are designated as nearby while other pairs are designated as far-away pairs. One advantage of this approach is that designations of nearby or far-away for pairs of mesh elements are unlikely to change as the layout is incrementally changed.

In this context, we assume that the mesh dimension is n and the grid dimension is m, so that interactions between pairs of mesh elements are modeled with vectors of different sizes depending on the designated proximity of the mesh element pairs. Collectively, these interactions can be modeled by the following equation (which is equivalent to equations (17a)-(17b)):

$$Ax = (D - \hat{D})x - IHPx. \tag{18}$$

Typically the n-dimensional vector x includes coefficients for the basis function expansion of the mesh elements and represents current in the layout. The n-x-n matrix A models impedance values so that Ax represents voltage in the layout. The representation on the right-hand-side of equation (18) represents different modeling for pairs of nearby and far-away elements.

The matrix D represents direct values for modeling impedances of nearby pairs of mesh elements. Typically, the direct values are determined by calculating potential values for an expansion of an electromagnetic field defined by values at the mesh elements. Conceptually, D is an n-x-n sparse matrix with non-zero values close to the diagonal for modeling interactions between basis functions for nearby mesh elements.

The matrix $\hat{D}$ represents pre-correction values for modeling impedances at nearby pairs of mesh elements to correct for PFFT grid calculations for these interactions. Typically these pre-correction values are determined by calculating a spatial-frequency approximation on the PFFT grid for electromagnetic interactions between nearby mesh-element pairs (e.g., through a convolution across the spatial frequencies defined by the PFFT grid) and then projecting back to the mesh-elements. Conceptually, $\hat{D}$ is an n-x-n sparse matrix with non-zero values close to the diagonal for modeling interactions between basis functions for nearby mesh elements.

The matrix H represents indirect values for modeling impedances at far-away pairs of mesh elements. Typically these indirect values are determined by calculating a spatial-frequency approximation on the PFFT grid for electromagnetic interactions between far-away mesh-element pairs (e.g., through a convolution across the spatial frequencies defined by the PFFT grid). Conceptually H is an m-x-m matrix that is typically implemented by means of an FFT (Fast Fourier Transform).

The matrix P represents projection values for projecting from the mesh coordinates (n-dimensional) to the grid coordinates (m-dimensional) where far-away interactions are modeled. Conceptually, P is an m-x-n matrix. The matrix I represents interpolating values for projecting from the grid coordinates (m-dimensional) to the mesh coordinates (n-dimensional). Conceptually, I is an n-x-m matrix.

In general, these matrices need not be formed explicitly. Typically a modeling goal relates to determining the currents that correspond to a nominal voltage input; that is one wishes to solve the equation Ax=b for given b, which represents a voltage input (e.g., a unit input at the location of a single port). However, because of the size of the matrices, this problem is typically solved iteratively (e.g., by a generalized minimal residual method or a conjugate gradient method), and so the model represented by equation (18) is implemented by forming matrix-vector products (Ax). Therefore, the focus of much of the following discussion relates to forming these matrix-vector products rather than actually solving the matrix equation Ax=b. In this context, a good initial approximation for x (e.g., current values) that corresponds to a given b (e.g., voltage values) reduces the number of iterations required to solve the matrix equation Ax=b.

Figure 11:
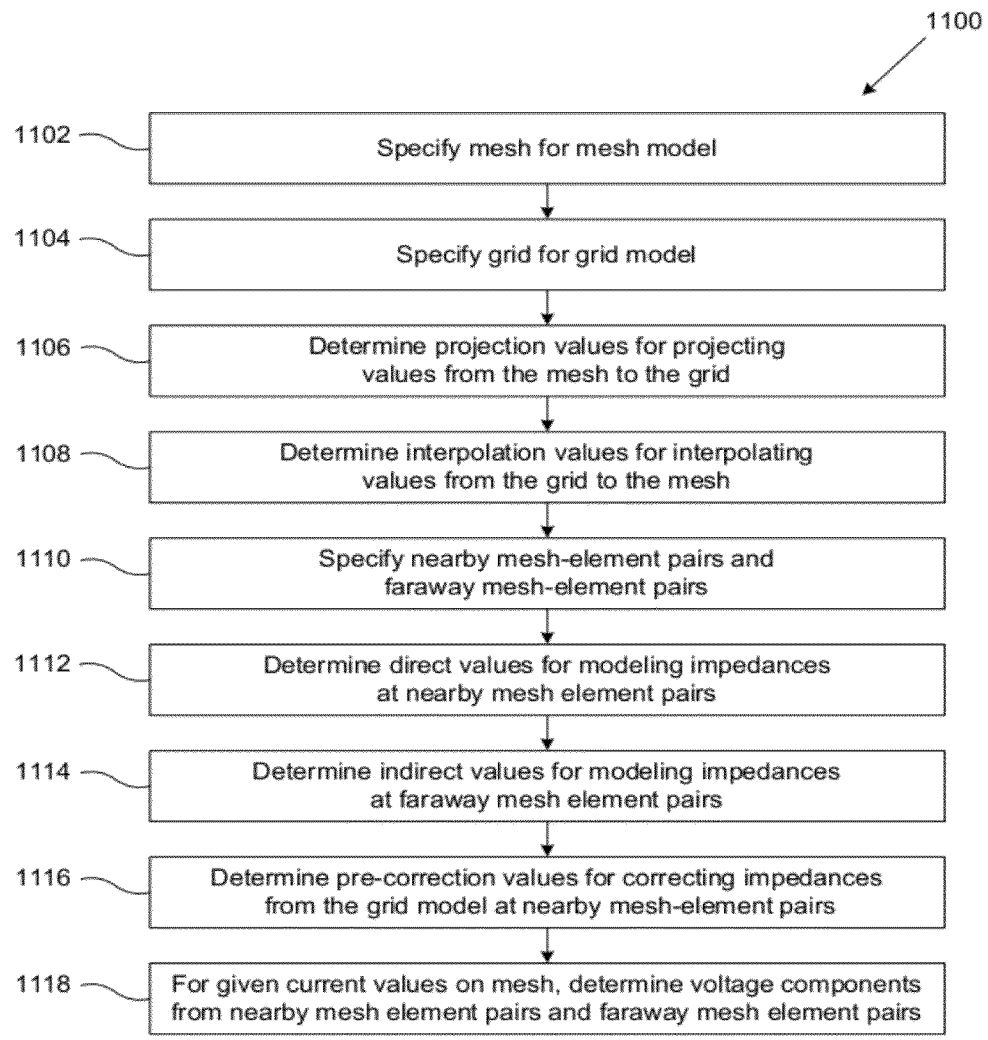
FIG. 11 shows a method of modeling a multi-layer IC for an embodiment of the present invention.

FIG. 11 shows a method 1100 of modeling a circuit for a related embodiment involving a mesh model and a grid model. First, specify a mesh for a mesh model including mesh elements for top walls, bottom walls and sidewalls 1102. Next, specify a grid for a grid model including top grids for top walls, bottom grids for bottom walls and (optionally) intermediate grids between pairs of top and bottom walls 1104. Next, determine projection value for projecting values from the mesh to the grid 1106. Next, determine interpolation values for interpolating values from the grid to the mesh 1108. Next, specify nearby mesh-element pairs and far-away mesh element pairs 1110. Next, determine direct values for modeling impedances at nearby mesh element pairs 1012. Next, determine indirect values for modeling impedances at far-away mesh element pairs 1014. Next, determine pre-correction values for correcting impedances from the grid model at nearby mesh element pairs 1016. Next, for given current values on the mesh, determine voltage components from nearby mesh element pairs and far-away mesh element pairs 1020.

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., keyboard, display, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof. For example, the system may be configured as part of a computer network that includes the Internet. At least some values for the results of the method can be saved for later use in a computer-readable medium, including memory (e.g., RAM (Random Access Memory)) and permanent storage (e.g., a hard-disk system).

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Figure 12:
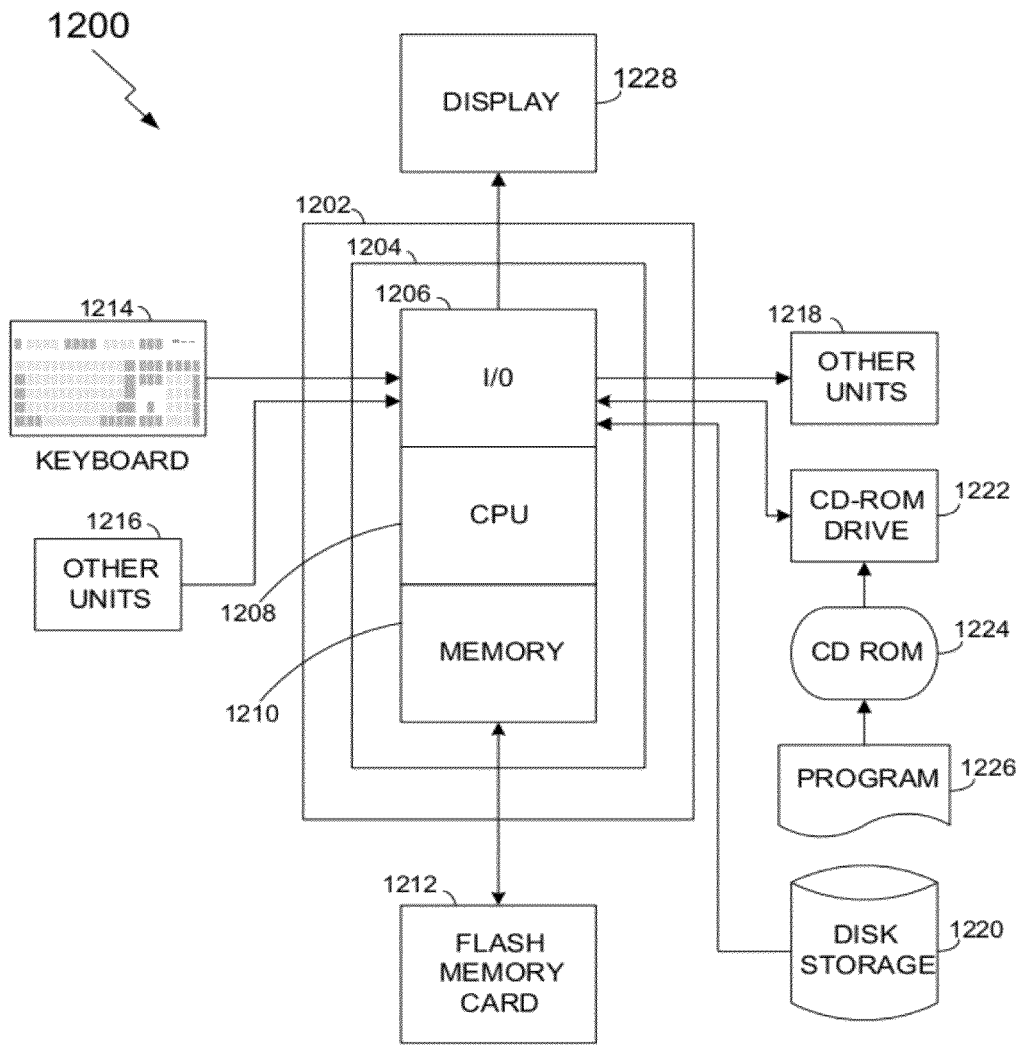
FIG. 12 shows a conventional general-purpose computer.

As described above, certain embodiments of the present invention can be implemented using standard computers. FIG. 12 shows a conventional general purpose computer 1200 with a number of standard components. The main system 1202 includes a motherboard 1204 having an input/output (I/O) section 1206, one or more central processing units (CPU) 1208, and a memory section 1210, which may have a flash memory card 1212 related to it. The I/O section 1206 is connected to a display 1228, a keyboard 1214, other similar general-purpose computer units 1216, 1218, a disk storage unit 1220 and a CD-ROM drive unit 1222. The CD-ROM drive unit 1222 can read a CD-ROM medium 1224 which typically contains programs 1226 and other data.

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A method of modeling an integrated circuit (IC) that includes one or more layers disposed on a substrate, each layer including a top wall, a bottom wall and a sidewall that connects the top wall and bottom wall, and the method comprising:

specifying a mesh for modeling the IC with a mesh model, wherein the mesh includes a plurality of mesh elements for defining values on the mesh from discrete values of the mesh elements, the mesh elements including top-wall elements for the one or more top walls, bottom-wall elements for the one or more bottom walls, and sidewall elements for the one or more sidewalls;

specifying a grid for a modeling of the IC with a grid model, wherein the grid includes a plurality of grid points for defining values on the grid, the grid including a top grid for each top wall and a bottom grid for each bottom wall;

determining projection values for projecting values from the mesh to the grid;

determining interpolation values for interpolating values from the grid to the mesh;

for at least some mesh elements, specifying at least some other mesh elements as nearby mesh elements or far-away mesh elements, whereby corresponding pairs of mesh elements are specified as nearby mesh-element pairs or far-away mesh-element pairs;

using at least one computer to determine direct values for modeling impedances at nearby mesh-element pairs of the IC by using the mesh model to calculate impedance values on the mesh for the one or more layers and the substrate;

using the at least one computer to determine indirect values for modeling impedances at far-away mesh-element pairs of the IC by using the grid model to calculate impedance values on the grid for the one or more layers and the substrate and using the projection values and the interpolation values to relate the grid and the mesh;

using the at least one computer to determine pre-correction values for correcting impedances from the grid model at nearby mesh-element pairs, wherein the direct values, the indirect values and the pre-correction values provide a decomposition of impedances for the IC and provide a corresponding decomposition of voltage values for specified current values of the IC; and saving one or more impedance values for the IC in a non-transitory computer-readable medium.

2. A method according to claim 1, further comprising:

specifying current values at the mesh elements for modeling current flow in the IC;

determining nearby components for the voltage values corresponding to the nearby mesh-element pairs from the current values, the direct values, and the pre-correction values by calculating values on the mesh;

determining far-away components for the voltage values corresponding to the far-away mesh-element pairs from the current values and the indirect values by projecting values from the mesh to the grid, convolving values on the grid, and interpolating values from the grid to the mesh;

determining voltage values at the mesh elements by combining the nearby components and the far-away components; and saving one or more voltage values for the IC.

3. A method according to claim 2, wherein the grid includes a plurality of sub-grids that lie in substantially parallel planes, and convolving values on the grid includes operations for transforming from spatial values to spectral values and operations for transforming from spectral values to spatial values.

4. A method according to claim 1, wherein the grid includes a plurality of sub-grids that lie in substantially parallel planes with uniformly spaced grid points.

5. A method according to claim 1, wherein for at least one layer the grid includes one or more intermediate grids that lie between the top grid and the bottom grid, and the top grid, the bottom grid and the one or more intermediate grids lie in substantially parallel planes.

6. A method according to claim 1, wherein determining the direct values includes calculating a basis-function expansion for modeling an electromagnetic field across the integrated circuit by a summation of basis functions that are defined across mesh elements by interpolations of corresponding mesh-element values.

7. A method according to claim 1, wherein determining the indirect values includes calculating a spatial-frequency expansion for modeling an electromagnetic field across the integrated circuit by a summation of spatial-frequency functions that are defined across the grid.

8. A method according to claim 1, wherein determining the indirect values includes calculating values for an impulse-response function between two grid points by including impedance effects of the substrate near the two grid points.

9. A method according to claim 1, wherein for at least one layer the top wall and the bottom wall are substantially planar and parallel to one another and the sidewall is substantially transverse to the top and bottom walls.

10. A method according to claim 1, wherein the projection values project values from each sidewall to portions of the grid that are connected by that sidewall.

11. A method according to claim 1, wherein specifying pairs of mesh elements as nearby mesh-element pairs or far-away mesh-element pairs includes calculating a distance between mesh-element pairs and comparing the distance between mesh-element pairs to a threshold distance.

12. A non-transitory computer-readable medium that stores a computer program for modeling an integrated circuit (IC) that includes one or more layers disposed on a substrate, each layer including a top wall, a bottom wall and a sidewall that connects the top wall and bottom wall, wherein the computer program includes instructions for:

specifying a mesh for modeling the IC with a mesh model, wherein the mesh includes a plurality of mesh elements for defining values on the mesh from discrete values of the mesh elements, the mesh elements including top-wall elements for the one or more top walls, bottom-wall elements for the one or more bottom walls, and sidewall elements for the one or more sidewalls;

specifying a grid for a modeling of the IC with a grid model, wherein the grid includes a plurality of grid points for defining values on the grid, the grid including a top grid for each top wall and a bottom grid for each bottom wall;

determining projection values for projecting values from the mesh to the grid;

determining interpolation values for interpolating values from the grid to the mesh;

for at least some mesh elements, specifying at least some other mesh elements as nearby mesh elements or far-away mesh elements, whereby corresponding pairs of mesh elements are specified as nearby mesh-element pairs or far-away mesh-element pairs;

determining direct values for modeling impedances at nearby mesh-element pairs of the IC by using the mesh model to calculate impedance values on the mesh for the one or more layers and the substrate;

determining indirect values for modeling impedances at far-away mesh-element pairs of the IC by using the grid model to calculate impedance values on the grid for the one or more layers and the substrate and using the projection values and the interpolation values to relate the grid and the mesh; and determining pre-correction values for correcting impedances from the grid model at nearby mesh-element pairs, wherein the direct values, the indirect values and the pre-correction values provide a decomposition of impedances for the IC and provide a corresponding decomposition of voltage values for specified current values of the IC.

13. A non-transitory computer-readable medium according to claim 12, wherein the computer program further includes instructions for:
specifying current values at the mesh elements for modeling current flow in the IC;
determining nearby components for the voltage values corresponding to the nearby mesh-element pairs from the current values, the direct values, and the pre-correction values by calculating values on the mesh;
determining far-away components for the voltage values corresponding to the far-away mesh-element pairs from the current values and the indirect values by projecting values from the mesh to the grid, convolving values on the grid, and interpolating values from the grid to the mesh; and
determining voltage values at the mesh elements by combining the nearby components and the far-away components.

14. A non-transitory computer-readable medium according to claim 13, wherein the grid includes a plurality of sub-grids that lie in substantially parallel planes, and
convolving values on the grid includes operations for transforming from spatial values to spectral values and operations for transforming from spectral values to spatial values.

15. A non-transitory computer-readable medium according to claim 12, wherein the grid includes a plurality of sub-grids that lie in substantially parallel planes with uniformly spaced grid points.

16. A non-transitory computer-readable medium according to claim 12, wherein for at least one layer the grid includes one or more intermediate grids that lie between the top grid and the bottom grid,
and the top grid, the bottom grid and the one or more intermediate grids lie in substantially parallel planes.

17. A non-transitory computer-readable medium according to claim 12, wherein determining the direct values includes calculating a basis-function expansion for modeling an electromagnetic field across the integrated circuit by a summation of basis functions that are defined across mesh elements by interpolations of corresponding mesh-element values.

18. A non-transitory computer-readable medium according to claim 12, wherein determining the indirect values includes calculating a spatial-frequency expansion for modeling an electromagnetic field across the integrated circuit by a summation of spatial-frequency functions that are defined across the grid.

19. A non-transitory computer-readable medium according to claim 12, wherein determining the indirect values includes calculating values for an impulse-response function between two grid points by including impedance effects of the substrate near the two grid points.

20. A non-transitory computer-readable medium according to claim 12, wherein for at least one layer the top wall and the bottom wall are substantially planar and parallel to one another and the sidewall is substantially transverse to the top and bottom walls.

21. A non-transitory computer-readable medium according to claim 12, wherein the projection values project values from each sidewall to portions of the grid that are connected by that sidewall.

22. A non-transitory computer-readable medium according to claim 12, wherein specifying pairs of mesh elements as nearby mesh-element pairs or far-away mesh-element pairs includes calculating a distance between mesh-element pairs and comparing the distance between mesh-element pairs to a threshold distance.

23. An apparatus for modeling an integrated circuit (IC) that includes one or more layers disposed on a substrate, each layer including a top wall, a bottom wall and a sidewall that connects the top wall and bottom wall, and the apparatus comprising a computer for executing computer instructions, wherein the computer includes computer instructions for:
specifying a mesh for modeling the IC with a mesh model, wherein the mesh includes a plurality of mesh elements for defining values on the mesh from discrete values of the mesh elements, the mesh elements including top-wall elements for the one or more top walls, bottom-wall elements for the one or more bottom walls, and sidewall elements for the one or more sidewalls;
specifying a grid for a modeling of the IC with a grid model, wherein the grid includes a plurality of grid points for defining values on the grid, the grid including a top grid for each top wall and a bottom grid for each bottom wall;
determining projection values for projecting values from the mesh to the grid;
determining interpolation values for interpolating values from the grid to the mesh;
for at least some mesh elements, specifying at least some other mesh elements as nearby mesh elements or far-away mesh elements, whereby corresponding pairs of mesh elements are specified as nearby mesh-element pairs or far-away mesh-element pairs;
determining direct values for modeling impedances at nearby mesh-element pairs of the IC by using the mesh model to calculate impedance values on the mesh for the one or more layers and the substrate;
determining indirect values for modeling impedances at far-away mesh-element pairs of the IC by using the grid model to calculate impedance values on the grid for the one or more layers and the substrate and using the projection values and the interpolation values to relate the grid and the mesh; and
determining pre-correction values for correcting impedances from the grid model at nearby mesh-element pairs, wherein the direct values, the indirect values and the pre-correction values provide a decomposition of impedances for the IC and provide a corresponding decomposition of voltage values for specified current values of the IC.

24. An apparatus according to claim 23, wherein the computer includes a processor with memory for executing at least some of the computer instructions.

25. An apparatus according to claim 23, wherein the computer includes circuitry for executing at least some of the computer instructions.

* * * * *